US012802743B2

(12) United States Patent
Kim et al.

(10) Patent No.: US 12,802,743 B2
(45) Date of Patent: Nov. 17, 2026

(54) SEMICONDUCTOR MEMORY DEVICE COMPRISING BITLINE SENSE AMPLIFIER AND METHOD OF CONTROLLING THE SAME

(71) Applicant: SAMSUNG ELECTRONICS CO., LTD., Suwon-si (KR)

(72) Inventors: Sunyoung Kim, Suwon-si (KR); Incheol Nam, Suwon-si (KR); Sangyun Kim, Suwon-si (KR); Younghun Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 147 days.

(21) Appl. No.: 18/738,711

(22) Filed: Jun. 10, 2024

(65) Prior Publication Data

US 2025/0201298 A1 Jun. 19, 2025

(30) Foreign Application Priority Data

Dec. 13, 2023 (KR) ........................ 10-2023-0180543

(51) Int. Cl.

*G11C 11/4091* (2006.01)
*G11C 11/4076* (2006.01)
*G11C 11/4094* (2006.01)

(52) U.S. Cl.

CPC ...... *G11C 11/4091* (2013.01); *G11C 11/4076* (2013.01); *G11C 11/4094* (2013.01)

(58) Field of Classification Search

CPC ............ G11C 11/4091; G11C 11/4076; G11C 11/4094

USPC .................................................. 365/189.011

See application file for complete search history.

(56) References Cited

U.S. PATENT DOCUMENTS

| | | | |
|---|---|---|---|
| 8,300,484 | B2 | 10/2012 | Yoshida |
| 9,343,137 | B2 | 5/2016 | Choi |
| 9,406,358 | B1 | 8/2016 | Lee |
| 11,031,067 | B2 | 6/2021 | Hwang |
| 11,335,385 | B2 | 5/2022 | Lam et al. |
| 11,581,032 | B2 | 2/2023 | Asaki |

(Continued)

FOREIGN PATENT DOCUMENTS

KR 10-0298191 B1 8/2001

*Primary Examiner* — Alexander Sofocleous
*Assistant Examiner* — Duy H Luong
(74) *Attorney, Agent, or Firm* — Sughrue Mion, PLLC

(57) ABSTRACT

Provided is a semiconductor memory device and a method of operating same, the semiconductor memory device including: a memory cell array including a memory cell; a bitline sense amplifier having an open bitline structure and including a plurality of switching transistors, wherein the bitline sense amplifier is connected to the memory cell via a bitline and a complementary bitline, and the plurality of switching transistors are configured to control connections between the bitline, the complementary bitline, a sensing bitline and a complementary sensing bitline based on a plurality of switching signals; a temperature measurement circuit configured to measure an operation temperature of the semiconductor memory device and to generate a temperature code corresponding to the operation temperature; and a sense amplifier controller configured to reduce sensing noise of the bitline sense amplifier by controlling timing of the plurality of switching signals based on the temperature code.

18 Claims, 31 Drawing Sheets

(56) References Cited

U.S. PATENT DOCUMENTS

| | | | | |
|---|---|---|---|---|
| 2015/0036444 | A1* | 2/2015 | Seo | G11C 11/4091 365/210.1 |
| 2022/0270654 | A1* | 8/2022 | Lam | G11C 11/4094 |
| 2023/0238052 | A1 | 7/2023 | Shang et al. | |
| 2024/0029782 | A1* | 1/2024 | Lee | G11C 11/4091 |

* cited by examiner

400

350

SEMICONDUCTOR MEMORY DEVICE COMPRISING BITLINE SENSE AMPLIFIER AND METHOD OF CONTROLLING THE SAME

CROSS-REFERENCE TO RELATED APPLICATION

This U.S. non-provisional application is based on and claims priority to Korean Patent Application No. 10-2023-0180543, filed on Dec. 13, 2023, in the Korean Intellectual Property Office, the disclosure of which is incorporated by reference herein in its entirety.

BACKGROUND

1. Field

The disclosure relates to semiconductor integrated circuits, and more particularly, to a semiconductor memory device capable of efficiently reducing sensing noises and a method of controlling same.

2. Discussion of Related Art

Semiconductor memory devices may be broadly categorized into volatile memory devices and nonvolatile memory devices. Volatile memory (e.g., DRAM or SRAM) devices have fast read and write times, but the data stored in them is lost if the power supply is interrupted. Nonvolatile memory devices, on the other hand, may retain data even if the power supply is interrupted.

A prime example of a volatile memory device is a dynamic random access memory (DRAM) device. A memory cell in DRAM may consist of one N-type metal oxide semiconductor (NMOS) transistor that acts as a switch and one capacitor that stores charge (data). Depending on the presence or absence of charge stored on the capacitor in the memory cell (i.e., whether the terminal voltage of the cell capacitor is high or low), the binary information “1” or “0” may be identified. The memory cell may be connected to a wordline and a bitline. The bitline may be connected to a bitline sense amplifier. The bitline sense amplifier may sense data stored in the memory cell via the bitline based on a voltage applied to the wordline.

The bitline sense amplifier may have an open bitline structure that is connected to the memory cells via bitlines and complementary bitlines. When a read operation or a refresh operation is performed in the volatile memory device, the bitline sense amplifier may detect and amplify a voltage difference between the bitline and the complementary bitline. The semiconductor devices comprising the bitline sense amplifier may be subject to process, voltage, and temperature (PVT) variations and the like, which may cause offset noise due to differences in characteristics between the devices such as differences in threshold voltage. In addition, data pattern noise may occur due to interference or coupling between signal lines and/or voltage lines according to the pattern of data stored in the memory cells. Further, charge leakage noise may occur due to charge leakage in the bitline sense amplifier. These sensing noises are variable with operation temperature, which reduces the effective sensing margin of the bitline sense amplifier and degrades the performance of the semiconductor memory device.

SUMMARY

Provided is a semiconductor memory device capable of efficiently reducing sensing noises according to an operation temperature and a method of controlling same.

According to an aspect of the disclosure, a semiconductor memory device includes: a memory cell array comprising a memory cell; a bitline sense amplifier having an open bitline structure and comprising a plurality of switching transistors, wherein the bitline sense amplifier is connected to the memory cell via a bitline and a complementary bitline, and the plurality of switching transistors are configured to control connections between the bitline, the complementary bitline, a sensing bitline and a complementary sensing bitline based on a plurality of switching signals; a temperature measurement circuit configured to measure an operation temperature of the semiconductor memory device and to generate a temperature code corresponding to the operation temperature; and a sense amplifier controller configured to reduce sensing noise of the bitline sense amplifier by controlling timing of the plurality of switching signals based on the temperature code.

According to an aspect of the disclosure, a semiconductor memory device includes: a memory cell array comprising a memory cell; a bitline sense amplifier having an open bitline structure, wherein the bitline sense amplifier is connected to the memory cell via a bitline and a complementary bitline, the bitline sense amplifier comprising: a first switching transistor configured to control a connection between the bitline and a complementary sensing bitline based on a first switching signal; a second switching transistor configured to control a connection between the complementary bitline and a sensing bitline based on the first switching signal; a third switching transistor configured to control a connection between the bitline and the sensing bitline based on a second switching signal; a fourth switching transistor configured to control a connection between the complementary bitline and the complementary sensing bitline based on the second switching signal; and a fifth switching transistor configured to control a connection between the sensing bitline and the complementary sensing bitline based on a third switching signal; a temperature measurement circuit configured to measure an operation temperature of the semiconductor memory device and to generate a temperature code corresponding to the operation temperature; and a sense amplifier controller configured to reduce sensing noise of the bitline sense amplifier by controlling timing of the first switching signal, the second switching signal and the third switching signal based on the operation temperature.

According to an aspect of the disclosure, a method of controlling a semiconductor memory device includes: providing a bitline sense amplifier having an open bitline structure and comprising a plurality of switching transistors, wherein the bitline sense amplifier is connected to a memory cell via a bitline and a complementary bitline, and wherein the plurality of switching transistors are configured to control connections between the bitline, the complementary bitline, a sensing bitline and a complementary sensing bitline based on a plurality of switching signals; measuring an operation temperature of the semiconductor memory device to generate a temperature code corresponding to the operation temperature; and based on the temperature code, controlling timing of the plurality of switching signals to reduce sensing noise of the bitline sense amplifier.

The semiconductor memory device and the method of controlling the semiconductor memory device according to one or more embodiments may increase the effective sensing margin of the bitline sense amplifier and enhance the performance of the semiconductor memory device by controlling the operation timing of the bitline sense amplifier to reduce the sensing noises according to the operation temperature.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
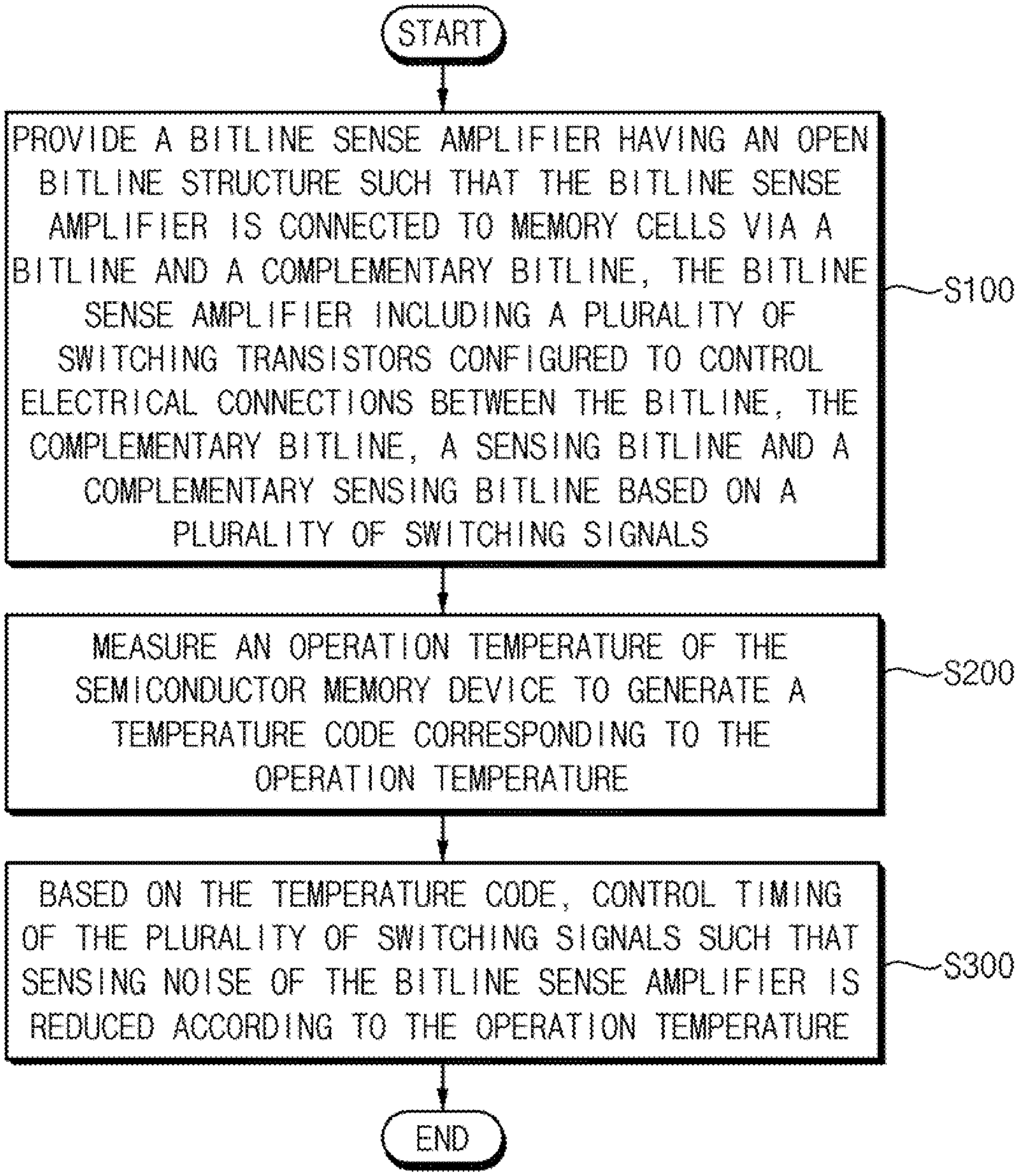
FIG. 1 is a flow chart illustrating a method of controlling a semiconductor memory device according to one or more embodiments.

One or more embodiments will be described more fully hereinafter with reference to the accompanying drawings, in which one or more example embodiments are shown. In the drawings, like numerals refer to like elements throughout.

Terms such as “unit”, “module”, “member”, and “block” may be embodied as hardware or software. As used herein, a plurality of “units”, “modules”, “members”, and “blocks” may be implemented as a single component, or a single “unit”, “module”, “member”, and “block” may include a plurality of components.

It will be understood that when an element is referred to as being “connected” with or to another element, it can be directly or indirectly connected to the other element.

Also, when a part “includes” or “comprises” an element, unless there is a particular description contrary thereto, the part may further include other elements, not excluding the other elements.

Throughout the description, when a member is “on” another member, this includes not only when the member is in contact with the other member, but also when there is another member between the two members.

Herein, the expressions “at least one of a, b or c” and “at least one of a, b and c” indicate “only a,” “only b,” “only c,” “both a and b,” “both a and c,” “both b and c,” and “all of a, b, and c.”

It will be understood that, although the terms “first”, “second”, “third”, etc., may be used herein to describe various elements, is the disclosure should not be limited by these terms. These terms are only used to distinguish one element from another element.

As used herein, the singular forms “a,” “an” and “the” are intended to include the plural forms as well, unless the context clearly indicates otherwise.

With regard to any method or process described herein, an identification code may be used for the convenience of the description but is not intended to illustrate the order of each step or operation. Each step or operation may be implemented in an order different from the illustrated order unless the context clearly indicates otherwise. One or more steps or operations may be omitted unless the context of the disclosure clearly indicates otherwise.

FIG. 1 is a flow chart illustrating a method of controlling a semiconductor memory device according to one or more embodiments.

Referring to FIG. 1, there is provided a bitline sense amplifier having an open bitline structure such that the bitline sense amplifier is connected to the memory cells via a bitline and a complementary bitline and the bitline sense amplifier includes a plurality of switching transistors configured to control electrical connections between the bitline, the complementary bitline, a sensing bitline, and a complementary sensing bitline based on a plurality of switching signals (S100). One or more embodiments of the open bitline structure and the bitline sense amplifier will be described below with reference to FIGS. 11, 12 and 13.

An operation temperature of a semiconductor memory device is measured and a temperature code corresponding to the operation temperature is generated (S200). The temperature code may be generated using a temperature measurement circuit formed on a semiconductor die of the semiconductor memory device. One or more embodiments of the temperature measurement circuit will be described below with reference to FIGS. 33 and 34.

Based on the temperature code, timing of the plurality of switching signals is controlled such that the sensing noise of the plurality of bitline sense amplifiers is reduced according to the operation temperature (S300). As will be described below with reference to FIG. 2, the sensing noises of the bitline sense amplifiers may be caused by various causes. As will be described further with reference to FIG. 3, the sensing noise characteristics may vary depending on the operation temperature of the semiconductor memory device and the sensing mode.

In an embodiment, as will be described further with reference to FIGS. 3 and 4, the operation temperature may be divided into a plurality of temperature ranges, and the timing of the plurality of switching signals may be controlled such that for each of the plurality of temperature ranges, the plurality of bitline sense amplifiers may operate in different sensing modes.

In an embodiment, as will be described below with reference to FIGS. 24 through 27, the timing of the plurality of switching signals may be controlled such that as the operation temperature increases, the floating time during which the sensing bitline and the complementary sensing bitline are floated may decrease.

As such, the method of controlling the semiconductor memory device according to one or more embodiments may increase the effective sensing margin of the bitline sense amplifier and enhance the performance of the semiconductor memory device by controlling the operation timing of the bitline sense amplifier to reduce the sensing noises according to the operation temperature.

Figure 2:
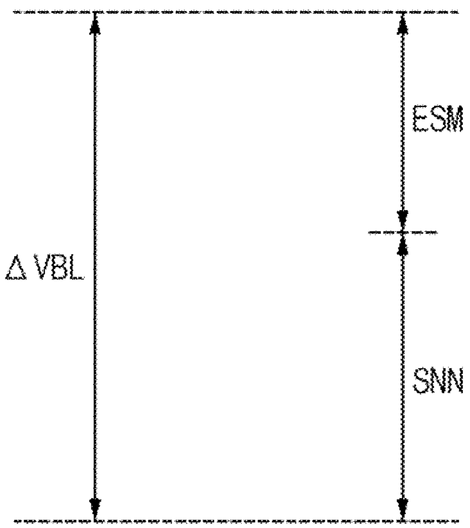
FIG. 2 is a diagram illustrating a sensing noise and an effective sensing margin of a semiconductor memory device.

FIG. 2 is a diagram illustrating a sensing noise and an effective sensing margin of a semiconductor memory device.

Based on the amount of charge on the capacitors included in the memory cell, the memory device may perform a read operation and a refresh operation. In this case, the bitlines associated with the memory cell are precharged with a precharge voltage. Then, as the wordline is activated, charge sharing occurs between the charge on the bitline charged with the precharge voltage and the charge on the capacitor of the memory cell. Due to charge sharing, a voltage on the bitline will decrease or increase by the amount of voltage change ΔVBL.

Referring to FIG. 2, the bitline sense amplifier may detect and amplify the voltage change ΔVBL. At this time, an effective sensing margin ESM of the bitline sense amplifier decreases as a sensing noise SNN increases, such as an offset noise attributable to the threshold voltage difference of the transistors of the bitline sense amplifier, a data pattern noise attributable to the patterns of the data stored in the memory cells, a charge leakage noise attributable to charge leakage on the sensing bitline and the complementary sensing bitline, and the like. As the sensing noise SNN increases, the effective sensing margin ESM decreases, and when the effective sensing margin ESM is below a certain level, the bitline sense amplifier may not detect the voltage change ΔVBL of the bitline.

The semiconductor memory device according to one or more embodiments may utilize the plurality of switching signals to reduce the offset noise. Further, the semiconductor memory device according to one or more embodiments may efficiently reduce the data pattern noise and the charge leakage noise that vary with operation temperature by controlling the timing of the plurality of switching signals according to the operation temperature.

Figure 3:
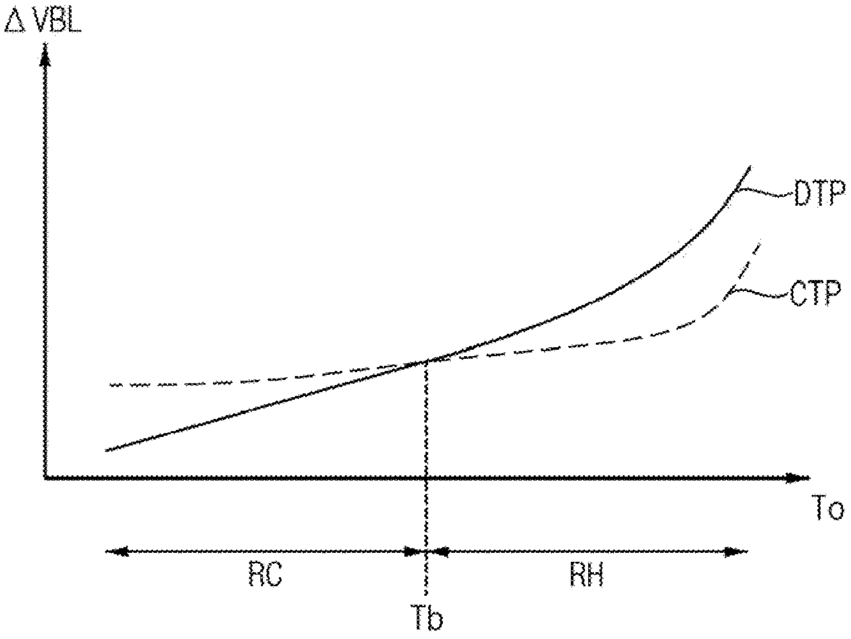
FIG. 3 is a graph illustrating an example of sensing modes and a characteristic according to an operation temperature of a semiconductor memory device according to one or more embodiments.

FIG. 3 is a diagram illustrating an example of sensing modes and a characteristic according to an operation temperature of a semiconductor memory device according to one or more embodiments.

FIG. 3 illustrates characteristics as a function of an operation temperature To for a D-type sensing mode DTP and a C-type sensing mode CTP. In FIG. 3, the horizontal axis represents the operation temperature To and the vertical axis represents the minimum amount of voltage change Δ VBL that may be sensed by the bitline sense amplifier.

Referring to FIG. 3, as the operation temperature To increases, the minimum sensible voltage change Δ VBL increases. In other words, the sensing capability of the bitline sense amplifier decreases as the operation temperature To increases. In a low temperature range RC below a boundary temperature Tb, the data pattern noise due to the pattern of the data stored in the memory cells dominates the charge leakage noise due to the charge leakage of the sensing bitline and the complementary sensing bitline. In contrast, in a high temperature range RH above the boundary temperature Tb, the charge leakage noise dominates the data pattern noise. Therefore, in the low temperature range RC, the D-type sensing mode DTP, which is relatively more effective in reducing the data pattern noise, is suitable, and in the high temperature range RH, the C-type sensing mode CTP, which is relatively more effective in reducing the charge leakage noise, is suitable. The boundary temperature Tb in FIG. 3 may change depending on the level of charge leakage due to the manufacturing process of the semiconductor memory device.

The two sensing modes, the D-type sensing mode DTP and the C-type sensing mode CTP, are illustrated in FIG. 3, but the disclosure is not limited thereto. According to one or more embodiments, the operation temperature To may be divided into two or more temperature ranges, and the timing of the plurality of switching signals may be controlled such that for each temperature range, the plurality of bitline sense amplifiers operate in different sensing modes best suited to reduce sensing noise.

Figure 4:
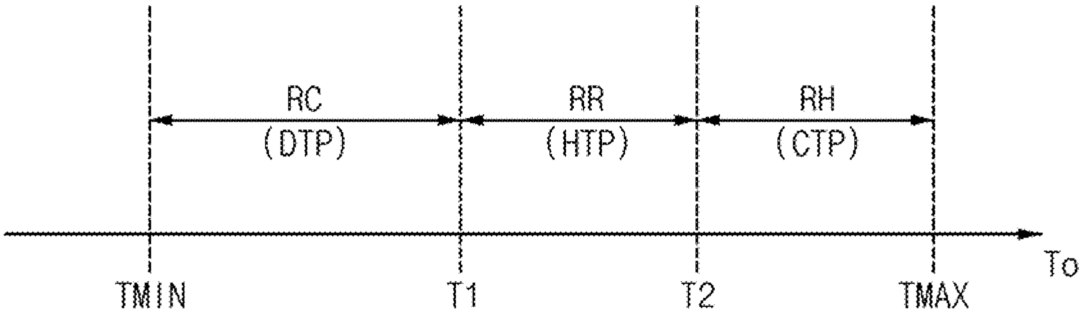
FIG. 4 is a diagram illustrating sensing modes depending on temperature ranges of a semiconductor memory device according to one or more embodiments.

FIG. 4 is a diagram illustrating sensing modes depending on temperature ranges of a semiconductor memory device according to one or more embodiments.

Referring to FIG. 4, an operation temperature To of a semiconductor memory device may be divided into a low temperature range RC between a minimum temperature TMIN and a first temperature T1, a normal temperature range RR between the first temperature T1 and a second temperature T2, and a high temperature range RH between the second temperature T2 and a maximum temperature TMAX. For example, the minimum temperature TMIN may be about −10° C., the first temperature T1 may be about 25° C., the second temperature T2 may be about 80° C., and the maximum temperature TMAX may be about 110° C.

As shown in FIG. 4, the bitline sense amplifier may be controlled such that the bitline sense amplifier operates in a D-type sensing mode DTP in the low temperature range RC, an H-type sensing mode HTP in the normal temperature range RR, and a C-type sensing mode CTP in the high temperature range RH. As will be described below with reference to FIG. 14, the H-type sensing mode HTP may effectively reduce the data pattern noise and the charge leakage noise simultaneously. As described below with reference to FIG. 22, the D-type sensing mode DTP may more effectively reduce the data pattern noise. As will be described below with reference to FIG. 23, the C-type sensing mode CTP may more effectively reduce charge leakage noise.

Figure 5:
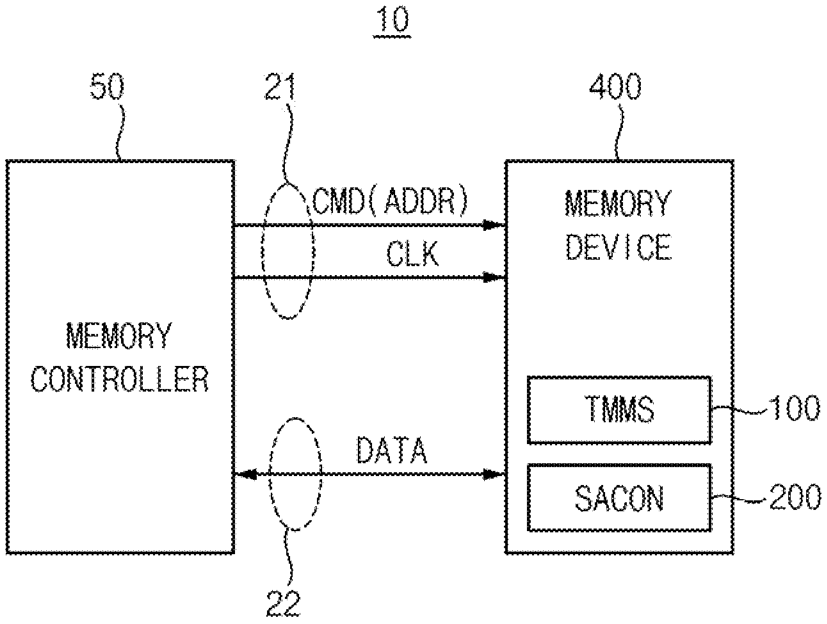
FIG. 5 is a block diagram illustrating a memory system according to one or more embodiments.

FIG. 5 is a block diagram illustrating a memory system according to one or more embodiments.

Referring to FIG. 5, a memory system 10 includes a memory controller 50 and a semiconductor memory device 400. Each of the memory controller 50 and the semiconductor memory device 400 includes an interface for communicating with each other.

The interfaces may be connected via a control bus 21 for transmitting a command CMD, an access address ADDR, a clock signal CLK, and the like, and a data bus 22 for transmitting data.

Depending on the type of semiconductor memory device, a command CMD may be considered to include an access address ADDR. The memory controller 50 generates command signals to control the semiconductor memory device 400, and under the control of the memory controller 50, data may be written to the semiconductor memory device 400 or data may be read from the semiconductor memory device 400.

The semiconductor memory device 400 may include a temperature measurement circuit TMMS 100 and a sense amplifier controller SACON 200.

As will be described below with reference to FIGS. 33 and 34, the temperature measurement circuit 100 may measure an operation temperature To of the semiconductor memory device 400 and generate a temperature code TCODE corresponding to the operation temperature To. The temperature measurement circuit 100 may include an on-chip temperature sensor formed on a semiconductor die of the semiconductor memory device 400. The on-chip temperature sensor may be utilized to accurately reflect the actual operation temperature To of the semiconductor memory device 400 to control its operation.

As will be described below with reference to FIG. 7, the sense amplifier controller 200 may control the timing of the plurality of switching signals based on the temperature code TCOD such that the sensing noise of the bitline sense amplifier may be reduced according to the operation temperature To.

Figure 6:
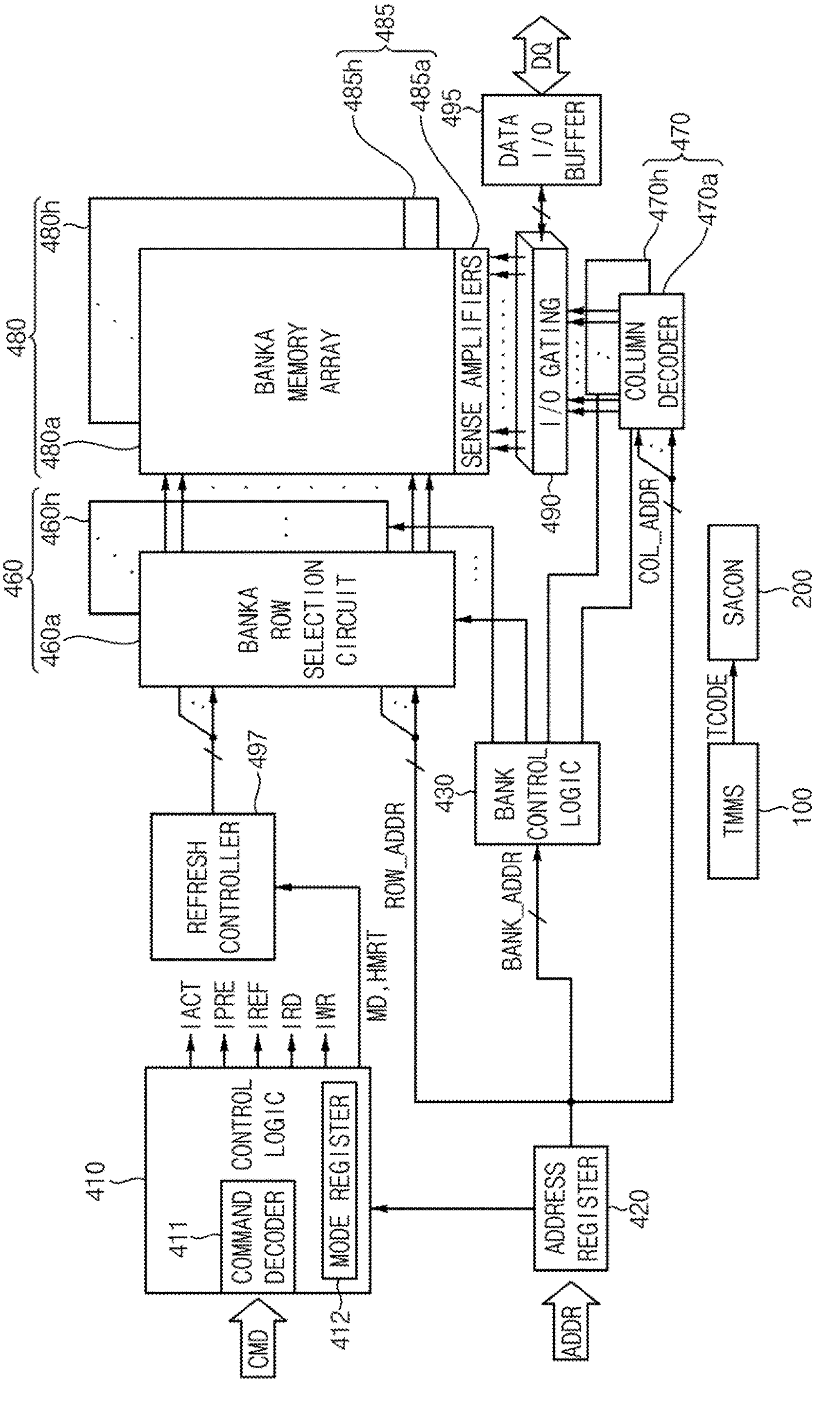
FIG. 6 is a block diagram illustrating a semiconductor memory device according to one or more embodiments.

FIG. 6 is a block diagram illustrating a semiconductor memory device according to one or more embodiments.

Referring to FIG. 6, a memory device 400 may include a command control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, a refresh controller 497, a temperature measurement circuit TMMS 100, and an sense amplifier controller SACON 200.

The memory cell array 480 may include a plurality of bank arrays 480*a*, . . . , 480*h*. The row selection circuit 460 may include a plurality of bank row selection circuits 460*a*, . . . , 460*h* respectively coupled to the bank arrays 480*a*, . . . , 480*h*. The column decoder 470 may include a plurality of bank column decoders 470*a*, . . . , 470*h* respectively coupled to the bank arrays 480*a*, . . . , 480*h*. The sense amplifier unit 485 may include a plurality of bank sense amplifiers 485*a*, . . . , 485*h* respectively coupled to the bank arrays 480*a*, . . . , 480*h*.

The address register 420 may receive an address ADDR including a bank address BANK_ADDR, a row address ROW_ADDR, and a column address COL_ADDR from the memory controller 50. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. One of the bank row selection circuits 460*a*, . . . , 460*h* corresponding to the bank address BANK_ADDR may be activated in response to the bank control signals, and one of the bank column decoders 470*a*, . . . , 470*h* corresponding to the bank address BANK_ADDR may be activated in response to the bank control signals.

The row address ROW_ADDR from the address register 420 may be applied to the bank row selection circuits 460*a*, . . . , 460*h*. The activated one of the bank row selection circuits 460*a*, . . . , 460*h* may decode the row address ROW_ADDR, and may activate a wordline corresponding to the row address ROW_ADDR. For example, the activated bank row selection circuit 460 may apply a wordline driving voltage to the wordline corresponding to the row address ROW_ADDR.

The column decoder 470 may include a column address latch. The column address latch may receive the column address COL_ADDR from the address register 420, and may temporarily store the received column address COL_ADDR. In one or more embodiments, in a burst mode, the column address latch may generate column addresses that increment from the received column address COL_ADDR. The column address latch may apply the temporarily stored or generated column address to the bank column decoders 470*a*, . . . , 470*h*.

The activated one of the bank column decoders 470*a*, . . . , 470*h* may decode the column address COL_ADDR, and may control the I/O gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480*a*, . . . , 480*h*, and write drivers for writing data to the bank arrays 480*a*, . . . , 480*h*.

Data to be read from one bank array of the bank arrays 480*a*, . . . , 480*h* may be sensed by one of the bank sense amplifiers 485*a*, . . . , 485*h* coupled to the one bank array from which the data is to be read, and may be stored in the read data latches. The data stored in the read data latches may be provided to the memory controller 50 via the data I/O buffer 495. Data DQ to be written in one bank array of the bank arrays 480*a*, . . . , 480*h* may be provided to the data I/O buffer 495 from the memory controller 50. The write driver may write the data DQ in one bank array of the bank arrays 480*a*, . . . , 480*h*.

The command control logic 410 may control operations of the memory device 400. For example, the command control logic 410 may generate control signals for the memory device 400 in order to perform a write operation, a read operation, or a refresh operation. The command control logic 410 may generate internal command signals such as an active signal IACT, a precharge signal IPRE, a refresh signal IREF, a read signal IRD, a write signal IWR, etc., based on commands CMD transferred from the memory controller 50 in FIG. 3. The command control logic 410 may include a command decoder 411 that decodes the commands CMD received from the memory controller 50 and a mode register set 412 that sets an operation mode of the memory device 400.

Although FIG. 6 illustrates the command control logic 410 and the address register 420 as being distinct from each other, the command control logic 410 and the address register 420 may be implemented as a single integrated circuit. In addition, although FIG. 6 illustrates the command CMD and the address ADDR being provided as distinct signals, the command CMD and the address ADDR may be provided as a combined signals, e.g., as specified by DDR5, HBM and LPDDR5 standards.

The temperature measurement circuit 100 may measure an operation temperature To of the semiconductor memory device 400 to generate a temperature code TCODE corresponding to the operation temperature To.

The sense amplifier controller 200 may control a plurality of bank sense amplifiers 485*a*, . . . , 485*h* included in the sense amplifier unit 485 based on the temperature code TCODE. In FIG. 6, the command control logic 410 and the sense amplifier controller 200 are shown as separate components, but the command control logic 410 and the sense amplifier controller 200 may be implemented as an inseparable component.

Figure 7:
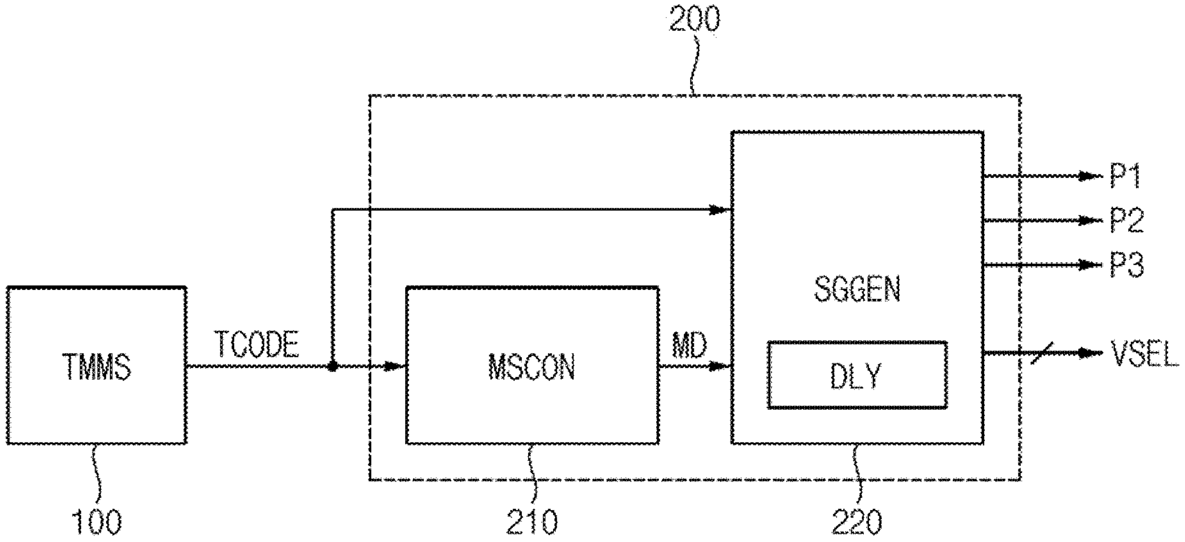
FIG. 7 is a block diagram illustrating a sense amplifier controller included in a semiconductor memory device according to one or more embodiments.

FIG. 7 is a block diagram illustrating a sense amplifier controller included in a semiconductor memory device according to one or more embodiments.

Referring to FIG. 7, a sense amplifier controller 200 may include a mode selector MSCON 210 and a signal generator SGGEN 220.

The mode selector 210 may generate a mode signal MD indicating a sensing mode based on a temperature code TCODE provided from the temperature measurement circuit TMMS 100. As described above, the mode selector 210 may divide the range of potential operation temperatures To into a plurality of temperature ranges and generate the mode signal MD to indicate a sensing mode corresponding to each temperature range. The information regarding the sensing mode corresponding to each temperature range may be provided in advance through a test process of the semiconductor memory device, and may be stored in a nonvolatile memory of the semiconductor memory device.

The signal generator 220 may generate a plurality of switching signals P1, P2 and P3 and voltage selection signals VSEL based on the mode signal MD and the temperature code TCODE. The signal generator 220 may include a delay circuit DLY or the like for controlling the timing of the plurality of switching signals P1, P2 and P3. The number of the plurality of switching signals P1, P2 and P3 and the number of the voltage select signals VSELs may be varied depending on the configuration and operation of the bitline sense amplifier.

Figure 8:
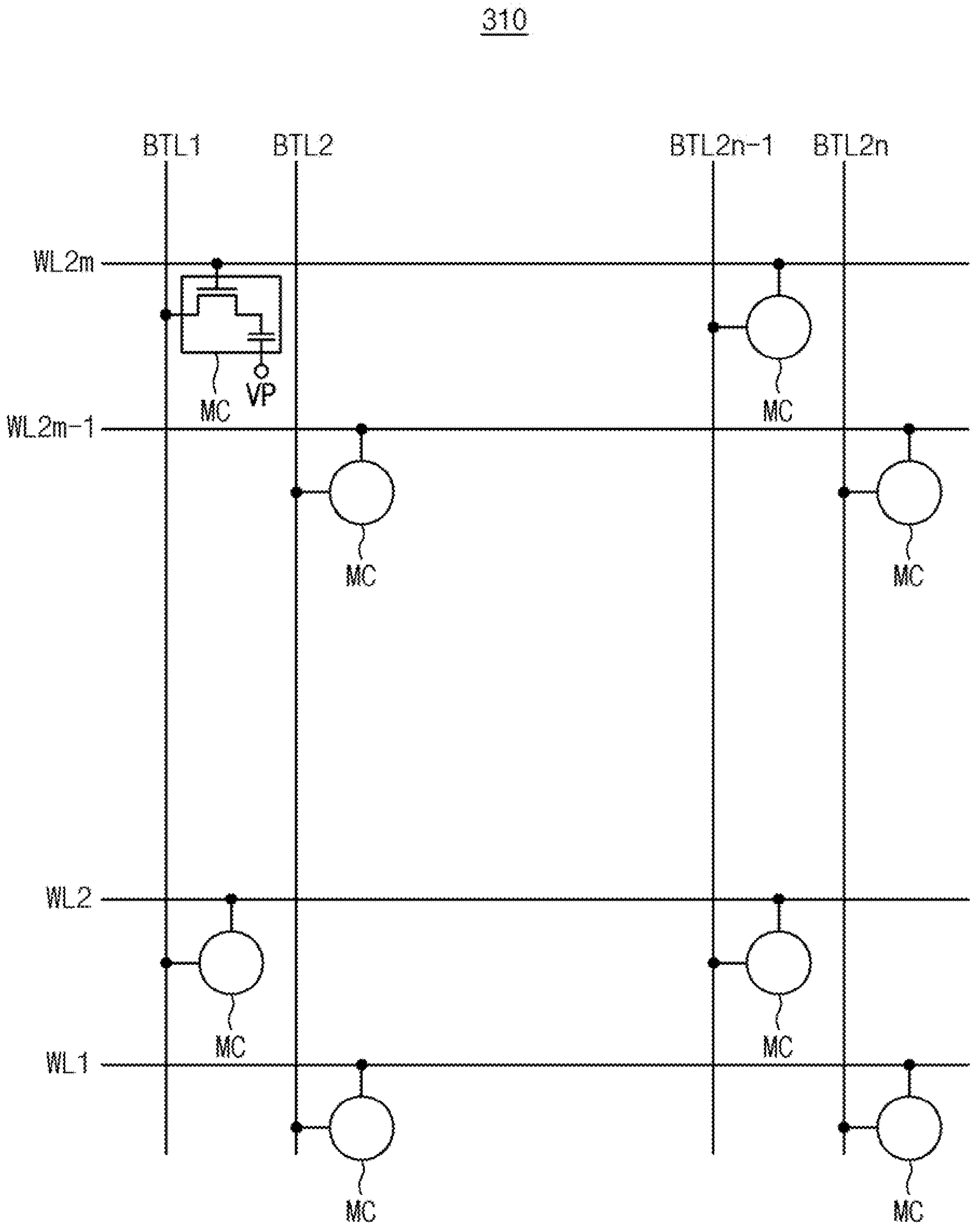
FIG. 8 is a diagram illustrating a bank array included in a semiconductor memory device according to one or more embodiments.

FIG. 8 is a diagram illustrating a bank array included in a semiconductor memory device according to one or more embodiments.

Referring to FIG. 8, a bank array 310 includes a plurality of wordlines WL1~WL2*m* (where m is a natural number greater than two), a plurality of bitlines BTL1~BTL2*n* (where n is a natural number greater than two), and a plurality of memory cells MCs disposed near intersections between the wordlines WL1~WL2*m* and the bitlines BTL1~BTL2*n*. In one or more embodiments, each of the plurality of memory cells MCs may include a DRAM cell structure as illustrated in FIG. 8. The memory cell MC may include a cell capacitor connected to the plate voltage VP and a cell transistor connected between each bitline and the cell capacitor, and the gate electrode of the cell transistor is connected to each wordline. The plurality of wordlines WL1~WL2*m* to which the plurality of memory cells MCs are connected may be referred to as rows of the bank array 310 and the plurality of bitlines BL1~BL3*n* to which the plurality of memory cells MCs are connected may be referred to as columns of the bank array 310.

Figure 9:
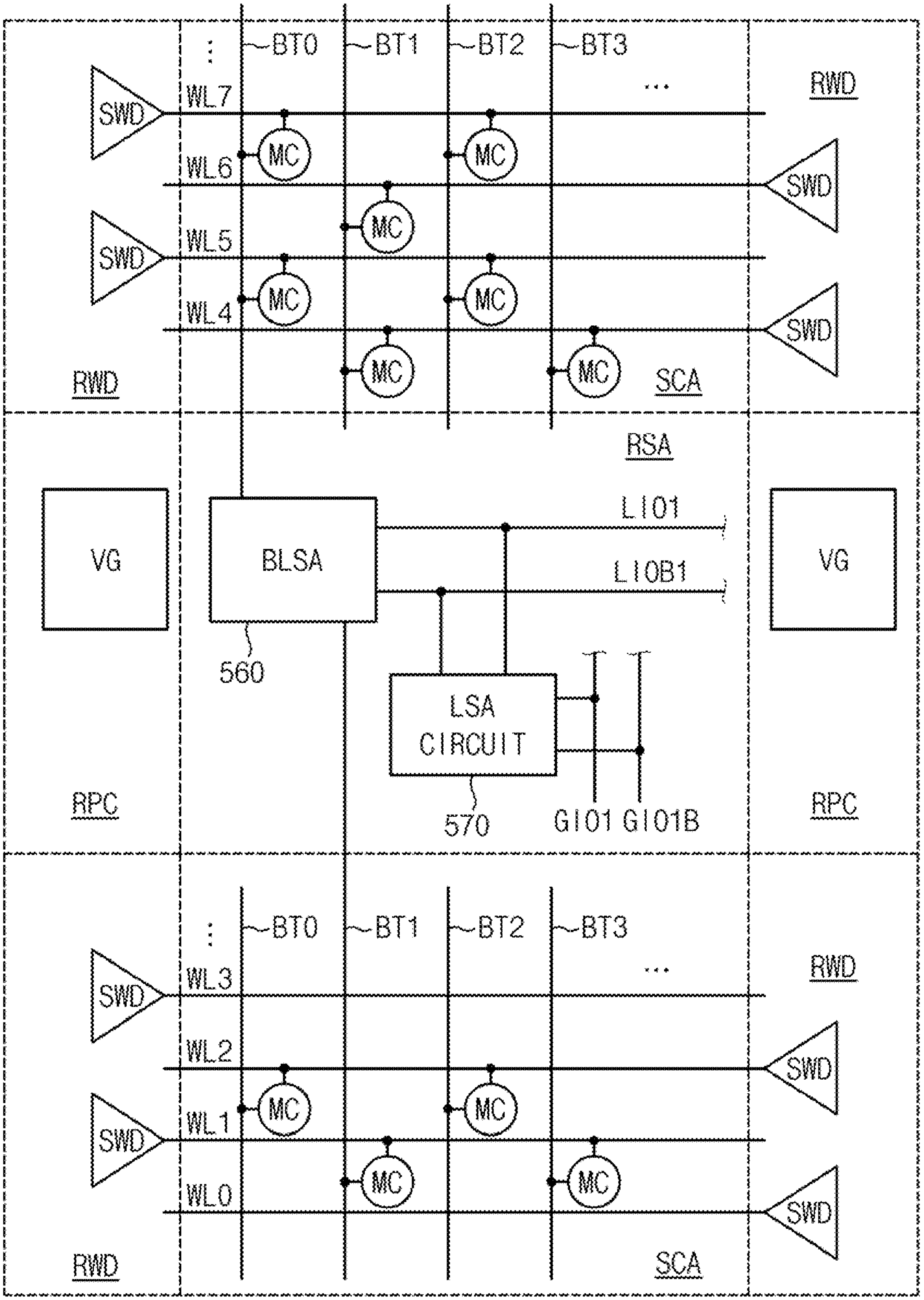
FIGS. 9 and 10 are diagrams illustrating a memory core circuit included in a semiconductor memory device according to one or more embodiments.
Figure 10:
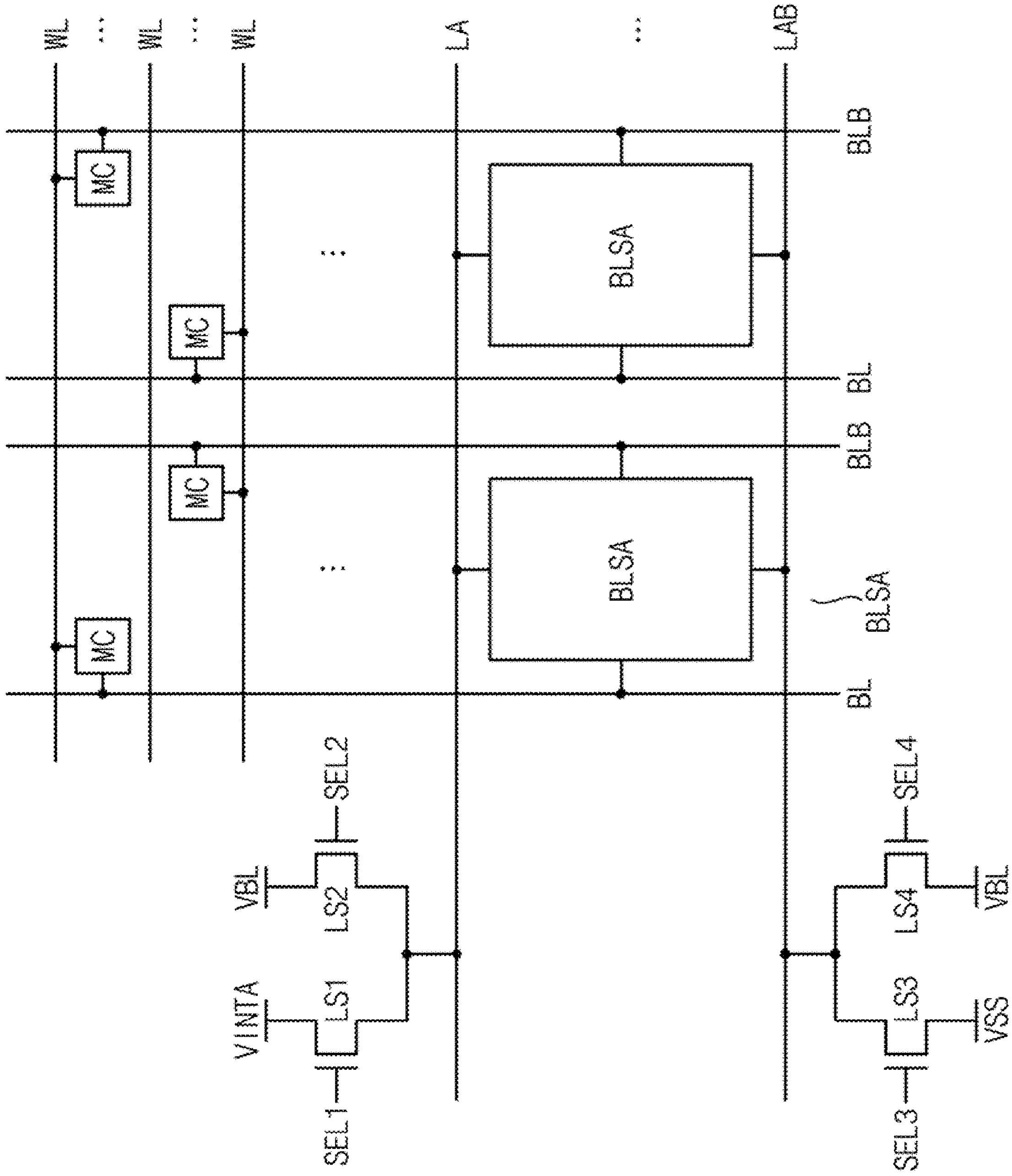

FIGS. 9 and 10 are diagrams illustrating a memory core circuit included in a semiconductor memory device according to one or more embodiments.

Referring to FIG. 9, sub-cell arrays SCA, sense amplifier areas RSA, wordline driver areas RWD, and power and control areas RPC may be disposed in the memory core circuit. In FIG. 9, decoder areas are omitted.

The sub-cell arrays SCA include a plurality of wordlines WL0 to WL7 extending in a row direction and a plurality of bitlines BT0 to BT3 extending in a column direction, and memory cells MC are disposed at points where the bitlines BT0 to BT3 and the wordlines WL0 to WL7 intersect.

The wordline driver areas RWD include a plurality of sub-wordline drivers SWD for respectively driving the plurality of wordlines WL0 to WL3.

The sense amplifier areas RSA include bitline sense amplifiers BLSA 560 and a local sense amplifier circuit (LSA circuit) 570 connected to the bitlines BT0 to BT3 of the sub-cell arrays SCA in an open bitline structure. The bitline sense amplifier BLSA may amplify the difference in voltage levels detected on the bitlines BT0 to BT3 and provide the difference in the amplified voltage levels to the local input/output line pair LIO1 and LIOB1.

In the power and control area RPC, a power circuit that supplies power to each sub-peripheral circuit and a control circuit that controls the operation of each sub-peripheral circuit are disposed. FIG. 9 shows voltage drivers VG that may be included in the power and control area RPC, but the disclosure is not limited thereto.

Referring to FIG. 10, voltage selection transistors LS1 and LS2 may apply an internal voltage VINTA or a precharge voltage VBL to a control line LA based on selection signals SEL1 and SEL2. Additionally, the voltage selection transistors LS3 and LS4 may apply a ground voltage VSS or the precharge voltage VBL to a complementary control line LAB based on selection signals SEL3 and SEL4. The selection signals SEL1 to SEL4 may be included in the voltage selection signals VSEL of FIG. 7.

In a semiconductor memory device, when a wordline WL selected by a row address is activated, data from a plurality of memory cells MC connected to the wordline WL are transferred to a bi-line pair BL and BLB, and a plurality of bits are transmitted. The bitline sense amplifiers BLSA detect and amplify the voltage difference between the bitline pair BL and BLB based on the voltage of the control line LA and the voltage of the complementary control line LAB. At this time, since a large number of bitline sense amplifiers BLSA operate at once, disturbance occurs in the internal voltage VINTA and the plate voltage VP applied to the memory cells, and the data pattern noise may be increased considerably according to the pattern of data stored in the memory cells.

Figure 11:
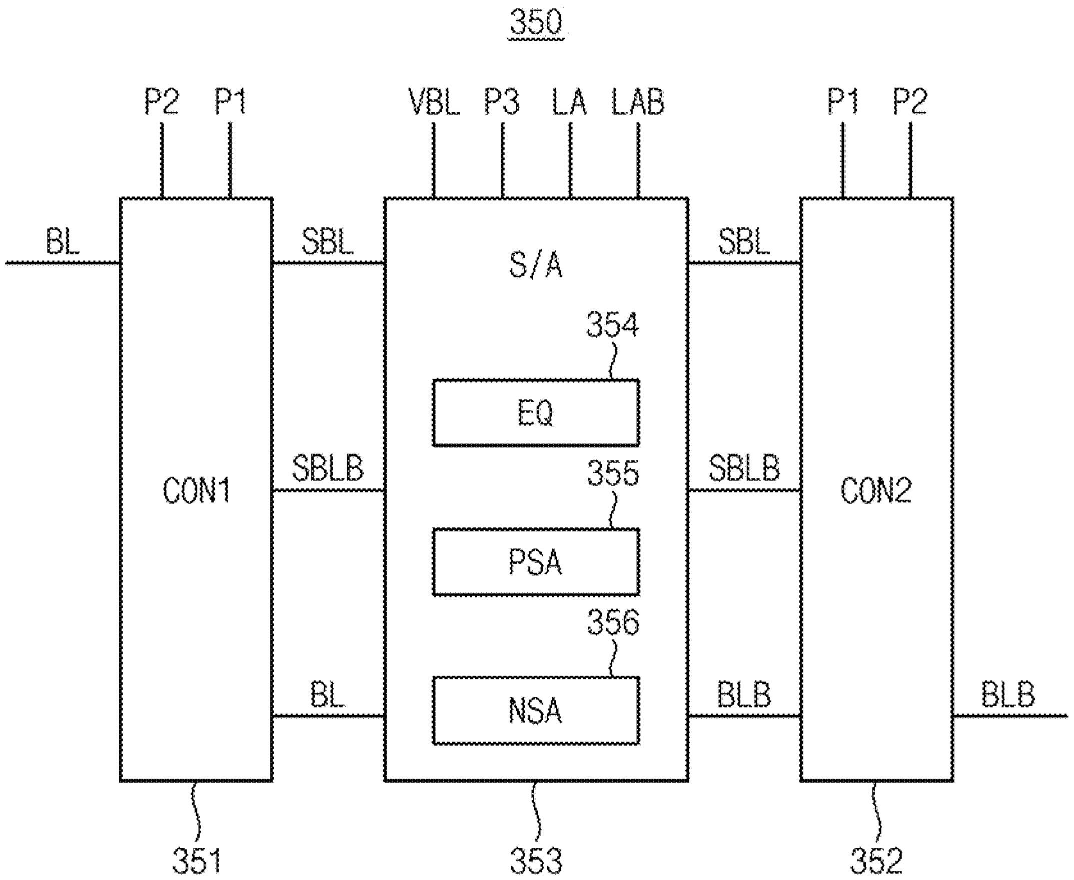
FIGS. 11 and 12 are diagrams illustrating a bitline sense amplifier included in a semiconductor memory device according to one or more embodiments.
Figure 12:
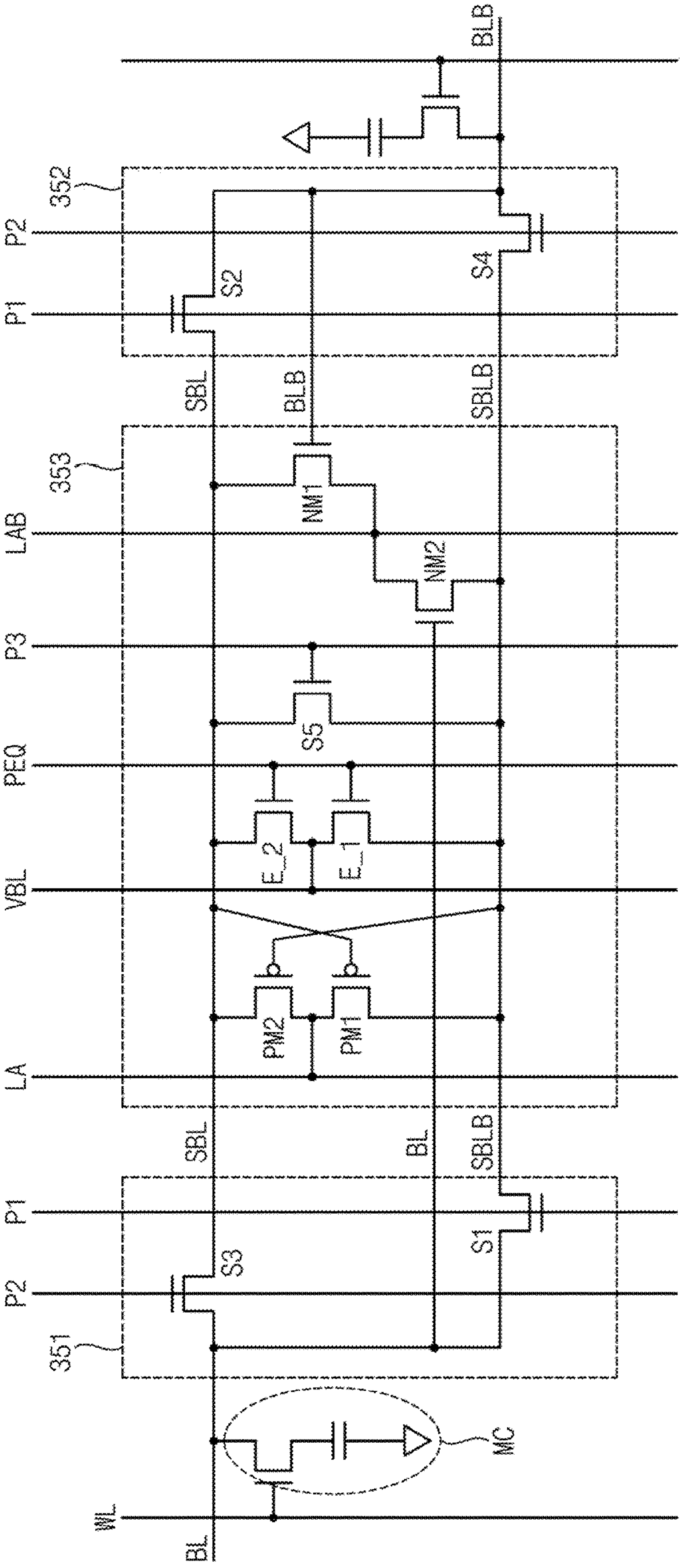
Figure 13:
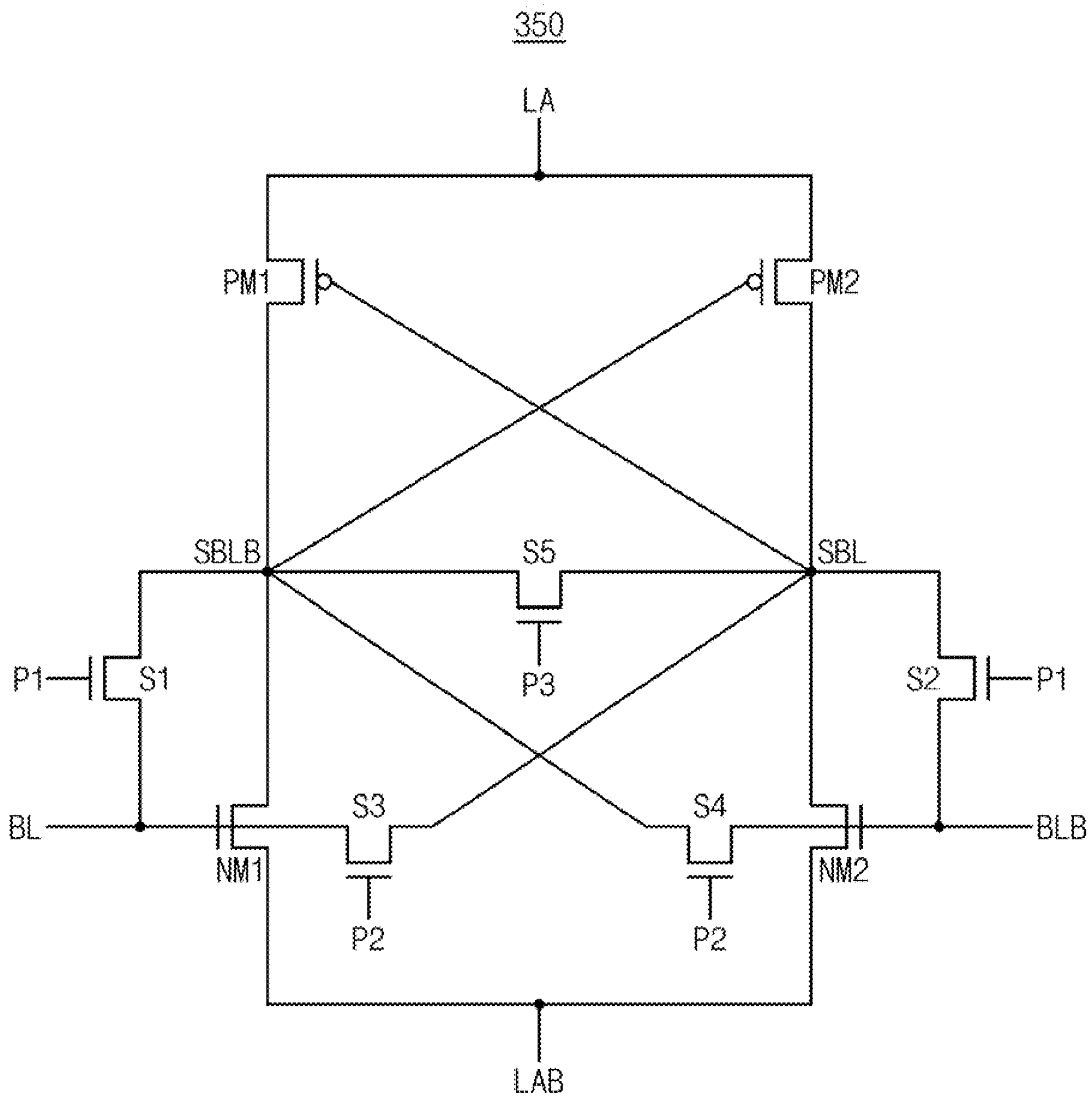
FIG. 13 is a diagram illustrating an equivalent circuit of a bitline sense amplifier of FIG. 12.

FIGS. 11 and 12 are diagrams illustrating a bitline sense amplifier included in a semiconductor memory device according to one or more embodiments, and FIG. 13 is a diagram illustrating an equivalent circuit of a bitline sense amplifier of FIG. 12.

Referring to FIGS. 11 and 12, a bitline sense amplifier 350 includes a first control circuit CON1 351, a second control circuit CON2 352, and a sense amplifier circuit 353.

The first control circuit 351 is coupled to a bitline BL, a sensing bitline SBL, and a complementary sensing bitline SBLB. The second control circuit 352 is coupled to the complementary bitline BLB, the sensing bitline SBL, and the complementary sensing bitline SBLB. The first and second control circuits 351 and 352 receive a first switching signal P1 and a second switching signal P2, and operate based on the first switching signal P1 and the second switching signal P2.

For example, the first control circuit 351 may, in response to the second switching signal P2, control an electrical connection between the bitline BL and the sensing bitline SBL, and in response to the first switching signal P1, control an electrical connection between the bitline BL and the complementary sensing bitline SBLB. The second control circuit 352 may control an electrical connection between the complementary bitline BL and the complementary sensing bitline SBLB in response to the second switching signal P2, and may control an electrical connection between the complementary bitline BL and the sensing bitline SBL in response to the first switching signal P1.

The sense amplifier 353 includes an equalization circuit EQ 354, a P-type sense amplifier PSA 355, and an N-type sense amplifier NSA 356. The sense amplifier 353 may detect and amplify a voltage difference between the bitline BL and the complementary bitline BLB based on the voltages of a control line LA and a complementary control line LAB.

The equalization circuit 354 may equalize the bitline pair BL and BLB and sensing bitline pair SBL and SBLB to a precharge voltage VBL. For example, in a precharge operation of the bitline sense amplifier 350, the first switching signal P1, the second switching signal P2, and the third switching signal P3 may be enabled (e.g., enabled to logic high level) such that the bitline pair BL and BLB and the sensing bitline pair SBL and SBLB may be connected as a single node. At this time, the equalization circuits E_1 and E_2 may respond to the equalization signal PEQ, and the bitline pair BL and BLB and the sensing bitline pair SBL and SBLB may be charged and equalized to the precharge voltage VBL.

Referring to FIGS. 12 and 13, the bitline sense amplifier 350 may include an N-type sense amplifier and a P-type sense amplifier. For example, the N-type sense amplifier may include a first N-type transistor NM1 and a second N-type transistor NM2. The P-type sense amplifier may comprise a first P-type transistor PM1 and a second P-type transistor PM2. The N-type sense amplifier and the P-type sense amplifier may amplify the amount of voltage change of the bitline BL according to a specified ratio during the bitline sensing operation.

According to an embodiment, the bitline sense amplifier 350 may include a plurality of switching transistors, such as first to fifth switching transistors S1 to S5. The first switching transistor S1 may be connected between the bitline BL and the complementary sensing bitline SBLB. The first switching transistor S1 may electrically connect or disconnect the bitline BL and the complementary sensing bitline SBLB based on the first switching signal P1. The second switching transistor S2 may be connected between the complementary bitline BLB and the complementary sensing bitline SBLB. The second switching transistor S2 may electrically connect or disconnect the complementary bitline BLB and the sensing bitline SBL based on the first switching signal P1. The third switching transistor S3 may be connected between the bitline BL and the sensing bitline SBL. The third switching transistor S3 may electrically connect or disconnect the bitline BL and the sensing bitline SBL based on the second switching signal P2. The fourth switching transistor S4 may be connected between the complementary bitline BLB and the complementary sensing bitline SBLB. The fourth switching transistor S4 may electrically connect or disconnect the complementary bitline BLB and the complementary sensing bitline SBLB based on the second switching signal P2. The fifth switching transistor S5 may be connected between the complementary sensing bitline SBLB and the sensing bitline SBL. The fifth switching transistor S5 may electrically connect or disconnect the sensing bitline SBL and the complementary sensing bitline SBLB based on the third switching signal P3.

According to an embodiment, the N-type sense amplifier and the P-type sense amplifier are connected between the complementary sensing bitline SBLB and the sensing bitline SBL, and may detect and amplify the voltage difference between the bitline BL and the complementary bitline BLB based on the voltage of the control line LA and the complementary control line LAB. For example, an end of the first P-type transistor PM1 may be connected to the control line LA, the other end of the first P-type transistor PM1 may be connected to the complementary sensing bitline SBLB, and the gate electrode of the first P-type transistor PM1 may be connected to the sensing bitline SBL. An end of the second P-type transistor PM2 may be connected to the control line LA, the other end of the second P-type transistor PM2 may be connected to the sensing bitline SBL, and the gate electrode of the second P-type transistor PM2 may be connected to the complementary sensing bitline SBLB. An end of the first N-type transistor NM1 may be connected to the complementary sensing bitline SBLB, the other end of the first N-type transistor NM1 may be connected to the complementary control line LAB, and the gate electrode of the first N-type transistor NM1 may be connected to the bitline BL. An end of the second N-type transistor NM2 may be connected to the sensing bitline SBL, the other end of the second N-type transistor NM2 may be connected to the complementary control line LAB, and the gate electrode of the second N-type transistor NM2 may be connected to the complementary bitline BLB.

Figure 14:
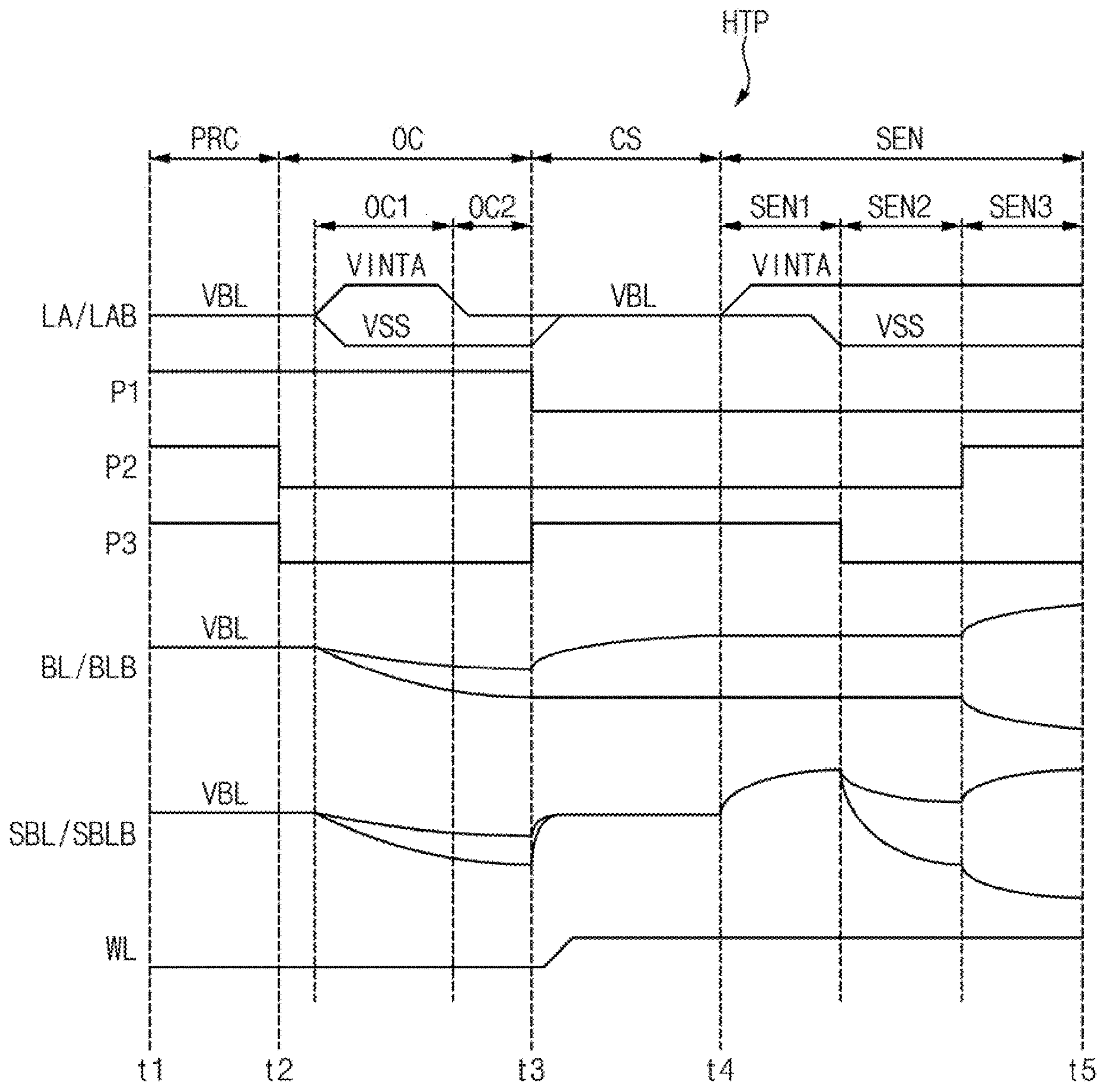
FIG. 14 is a timing diagram illustrating an H-type sensing mode of a bitline sense amplifier included in a semiconductor memory device according to one or more embodiments.

FIG. 14 is a timing diagram illustrating an H-type sensing mode of a bitline sense amplifier included in a semiconductor memory device according to one or more embodiments.

Referring to FIGS. 13 and 14, operation periods of the bitline sense amplifier 350 may sequentially include a precharge period PRC, an offset compensation period OC, a charge sharing period CS, and a sensing period SEN. The semiconductor memory device may compensate for the offset voltage between the bitline BL and the complementary bitline BLB by performing bitline offset compensation operations and may accurately read the data stored in the memory cell by performing bitline sensing operations.

In the precharge period PRC, the first switching signal P1, the second switching signal P2, and the third switching signal P3 are activated (e.g., activated to a logic high level), such that the bitline pair BL and BLB and the sensing bitline pair SBL and SBLB may be connected as one node. At this time, the control line LA and the complementary control line LAB may have a precharge voltage VBL such that the bitline pair BL and BLB and the sensing bitline pair SBL and SBLB may be charged and equalized to the precharge voltage VBL.

In the offset compensation period OC, the bitline sense amplifier 350 may measure and compensate for an offset voltage between the bitline BL and the complementary bitline BLB based on a bitline offset compensation method as will be described below with reference to FIGS. 15 through 18.

In the charge sharing period CS, the precharge voltage VBL may be applied to the control line LA and the complementary control line LAB. The third switching signal P3 may be changed to the logic high level, and the sensing bitline SBL and the complementary sensing bitline SBLB may be connected to each other. Accordingly, the sensing bitline SBL and the complementary sensing bitline SBLB may be changed to the precharge voltage VBL. At this time, the wordline WL may be changed to a high level, and charge sharing may occur between the charge stored in the cell capacitor CC of the memory cell MC and the charge stored in the bitline BL.

In the sensing period SEN, the bitline sense amplifier 350 may sense the voltage on the bitline BL based on a bitline sensing method as described below with reference to FIGS. 19 through 21.

Figure 15:
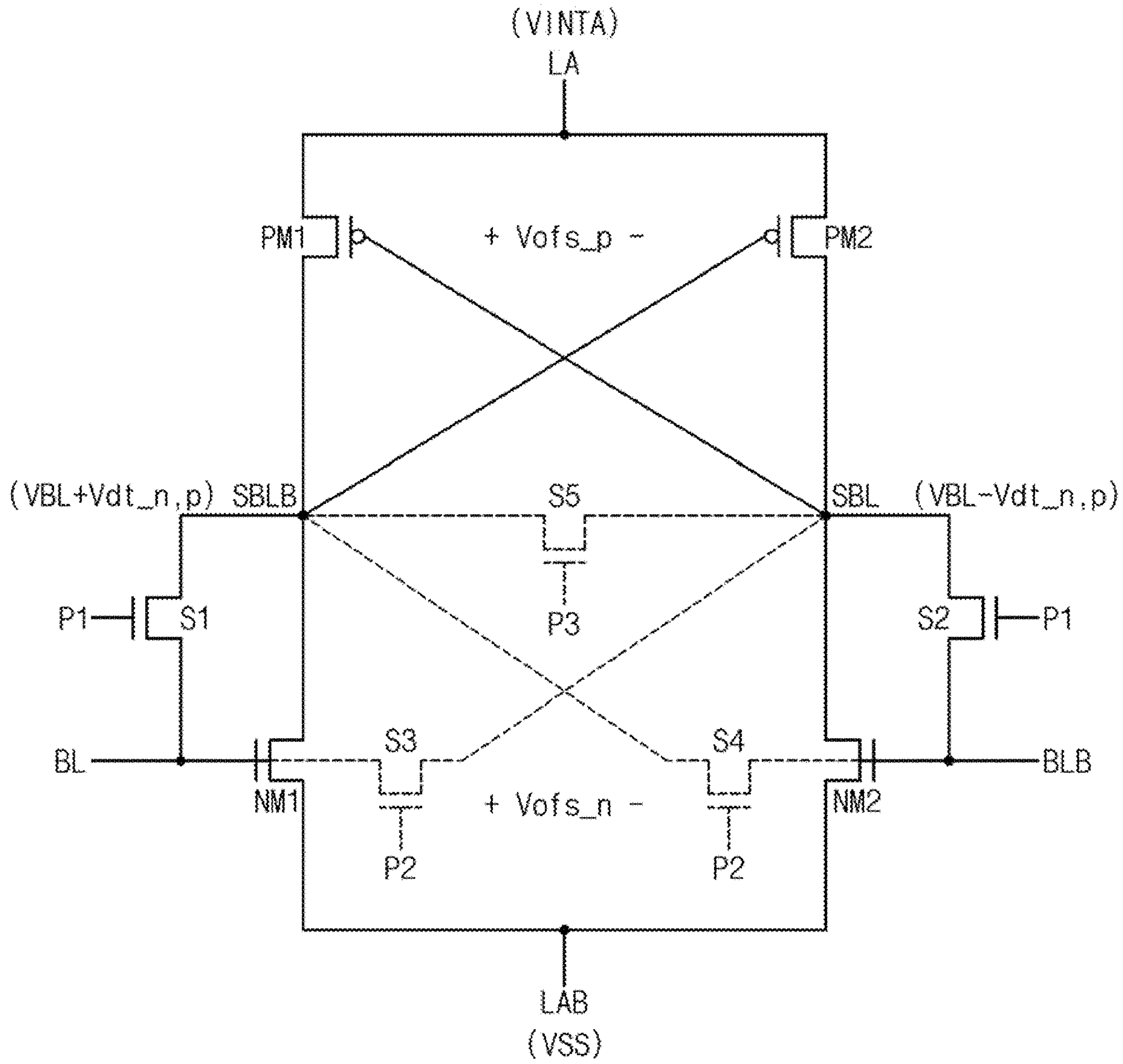
FIG. 15 is a diagram illustrating an offset compensation operation of the bitline sense amplifier of FIG. 13 in a first offset compensation period of FIG. 14.
Figure 16:
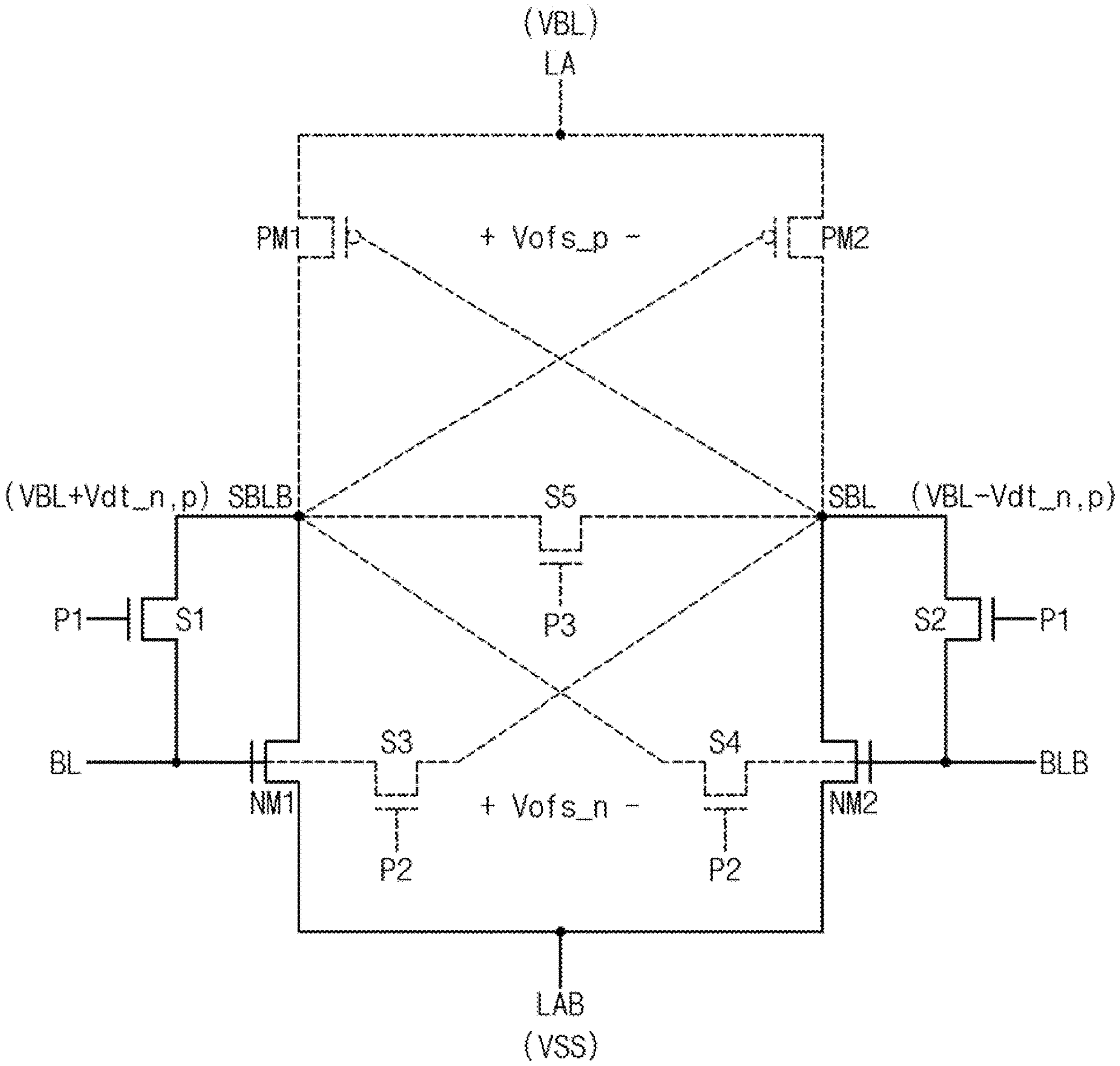
FIG. 16 is a diagram illustrating an offset compensation operation of the bitline sense amplifier of FIG. 13 in a second offset compensation period of FIG. 14.
Figure 17:
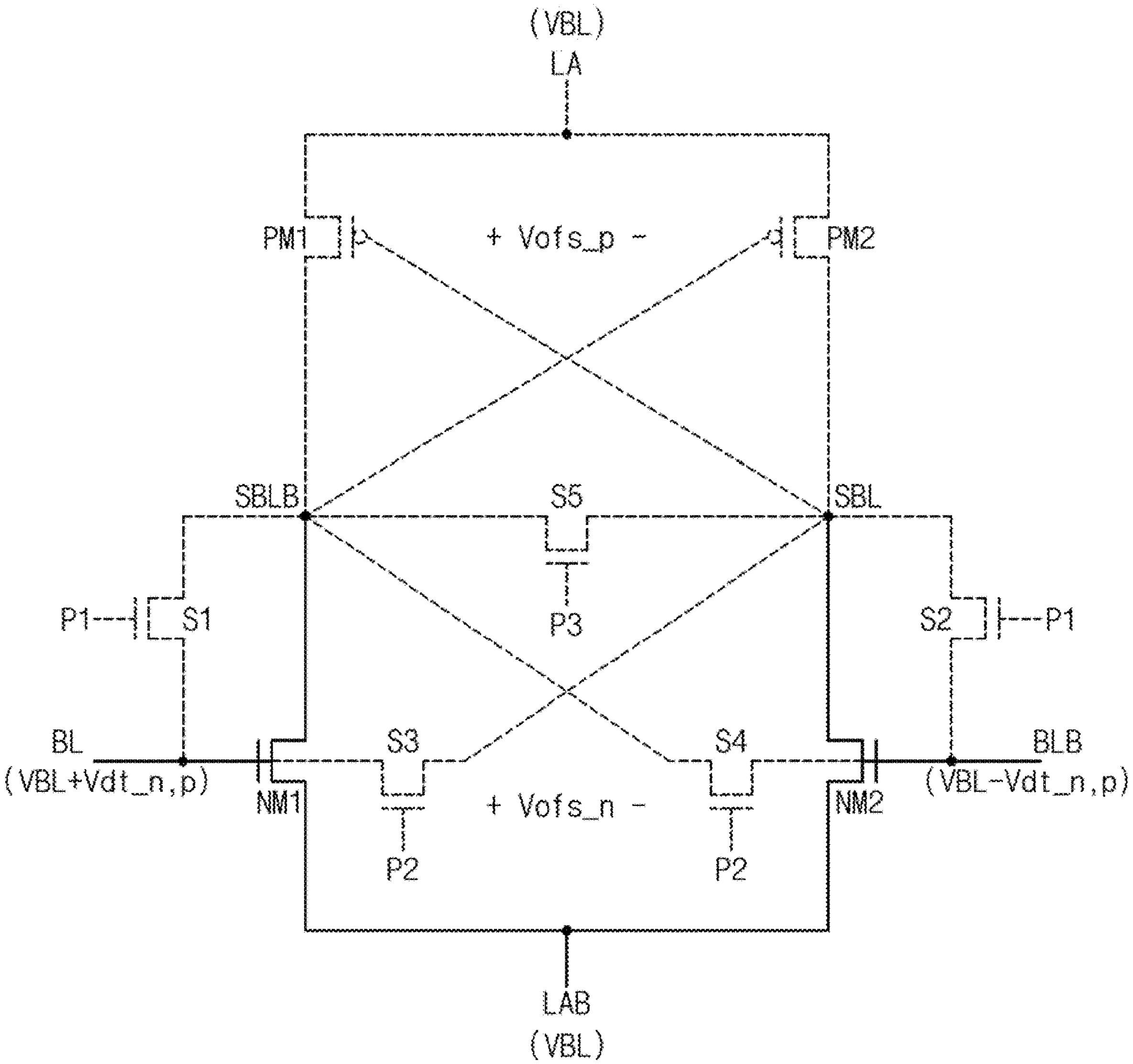
FIG. 17 is a diagram illustrating an offset compensation operation of the bitline sense amplifier of FIG. 13 after the second offset compensation period of FIG. 14.

FIG. 15 is a diagram illustrating an offset compensation operation of the bitline sense amplifier of FIG. 13 in a first offset compensation period of FIG. 14, FIG. 16 is a diagram illustrating an offset compensation operation of the bitline sense amplifier of FIG. 13 in a second offset compensation period of FIG. 14, and FIG. 17 is a diagram illustrating an offset compensation operation of the bitline sense amplifier of FIG. 13 after the second offset compensation period of FIG. 14.

Referring to FIGS. 14 through 17, the bitline sense amplifier 350 may operate as a negative feedback offset compensation scheme in the first offset compensation period OC1. The bitline sense amplifier 350 may operate as a diode offset compensation scheme in the second offset compensation period OC2. While the negative feedback offset compensation scheme is fast to operate, the efficiency of the offset compensation may be reduced by scattering of the sensing characteristics due to process, voltage, and temperature (PVT) variations. On the other hand, the diode offset compensation method may have good PVT characteristics but slow operation speed. The semiconductor memory device according to one or more embodiments may perform the offset compensation operation of the bitline sense amplifier 350 in a hybrid offset method that combines the advantages of the negative feedback offset compensation method and the diode offset compensation method.

In the first offset compensation period OC1 (see FIG. 15), the bitline sense amplifier 350 may perform a first offset compensation operation. For example, the first switching signal P1 may remain activated at a logic high level. The second switching signal P2 and the third switching signal P3 may be deactivated to a logic low level. Accordingly, the sensing bitline SBL and the complementary sensing bitline SBLB may be electrically disconnected (or isolated) from each other. The bitline BL and the sensing bitline SBL may be electrically disconnected from each other. The complementary bitline BLB and the complementary sensing bitline SBLB may be electrically disconnected from each other. At this time, the control line LA may be applied with an internal voltage VINTA higher than the precharge voltage VBL, and the complementary control line LAB may be applied with a ground voltage VSS lower than the precharge voltage VBL.

In the first offset compensation period OC1, the bitline BL and the complementary bitline BLB (or the sensing bitline SBL and the complementary sensing bitline SBLB) may have a predetermined voltage difference (hereinafter, the offset voltage difference) due to the offset of the N-type sense amplifier and the P-type sense amplifier. For example, the bitline BL and the complementary bitline BLB may have an N-type offset voltage Vofs_n by the offset of the first N-type transistor NM1 and the second N-type transistor NM2. Further, the bitline BL and the complementary bitline BLB may have a P-type offset voltage Vofs_p by the offset of the first P-type transistor PM1 and the second P-type transistor PM2, i.e., the bitline BL and the complementary bitline BLB may have an offset voltage difference 2Vdt_n,p that is the sum of the N-type offset voltage Vofs_n and the P-type offset voltage Vofs_p. The N-type offset voltage Vofs_n may account for a first offset compensation ratio Voc_n1 (e.g., 70%) of the offset voltage difference 2Vdt_n,p. The P-type offset voltage Vofs_p may account for a second offset compensation ratio Voc_p1 (e.g., 30%) of the offset voltage difference 2Vdt_n,p that is smaller than the first offset compensation ratio Voc_n1.

In the second offset compensation interval OC2 (see FIG. 16), the bitline sense amplifier 350 may perform a second offset compensation operation. For example, the first switching signal P1 may be maintained at the logic high level. The second switching signal P2 and the third switching signal P3 may be maintained at the logic low level. Accordingly, the complementary sensing bitline SBLB and the sensing bitline SBL may be electrically disconnected from each other. The bitline BL and the sensing bitline SBL may be electrically disconnected from each other. The complementary bitline BLB and the complementary sensing bitline SBLB may be electrically disconnected from each other. At this time, the control line LA may change from the internal voltage VINTA to the precharge voltage VBL. The complementary control line LAB may be maintained at the ground voltage VSS. Thus, the first P-type transistor PM1 and the second P-type transistor PM2 may be turned off.

In the second offset compensation period OC2, as the first P-type transistor PM1 and the second P-type transistor PM2 are turned off, the ratio of the N-type offset voltage Vofs_n and the P-type offset voltage Vofs_p between the bitline BL and the complementary bitline BLB (or between the complementary sensing bitline SBLB and the sensing bitline SBL) may change. For example, the N-type offset voltage Vofs_n may account for a third offset compensation ratio Voc_n2 (e.g., 90%) of the offset voltage difference 2Vdt_n,p that is greater than the first offset compensation ratio Voc_n1. The P-type offset voltage Vofs_p may account for a fourth offset compensation ratio Voc_p2 (e.g., 10%) of the offset voltage difference 2Vdt_n,p that is less than the second offset compensation ratio Voc_p1. In one example, the fourth offset compensation ratio Voc_p2 may be set to 10% or less.

According to an embodiment, after the second offset compensation interval OC2 (see FIG. 17), the bitline sense amplifier 350 may perform a bitline offset detection operation between the bitline BL and the complementary bitline BLB. For example, the first switching signal P1 may be changed to a logic low level. Accordingly, the bitline BL and the sensing bitline SBL may be electrically disconnected from each other. Further, the complementary bitline BLB and the complementary sensing bitline SBLB may be disconnected from each other. The third switching signal P3 may be changed to a logic high level. Accordingly, the sensing bitline SBL and the complementary sensing bitline SBLB may be electrically connected to each other. The complementary control line LAB may be changed to the precharge voltage VBL. Thus, the bitline BL and the complementary bitline BLB may maintain the offset voltage difference 2Vdt_n,p. Further, the sensing bitline SBL and the complementary sensing bitline SBLB may have the precharge voltage VBL via the complementary control line LAB.

As described above, the bitline sense amplifier 350 may quickly detect the offset voltage difference 2Vdt_n,p that includes an N-type offset voltage Vofs_n and a P-type offset voltage Vofs_p via the negative feedback offset compensation scheme in the first offset compensation period OC1. Furthermore, the bitline sense amplifier 350 may improve the PVT characteristics through the diode offset compensation scheme in the second offset compensation period OC2 to finally detect the offset voltage difference 2Vdt_n,p. The bitline sense amplifier 350 may change the ratio of the N-type offset voltage Vofs_n and the P-type offset voltage Vofs_p that includes the offset voltage difference 2Vdt_n,p through the first offset compensation period OC1 and the second offset compensation period OC2. By changing the ratio of the N-type offset voltage Vofs_n and the P-type offset voltage Vofs_p, the bitline sense amplifier 350 may improve the accuracy of the bitline sensing operation.

Figure 18:
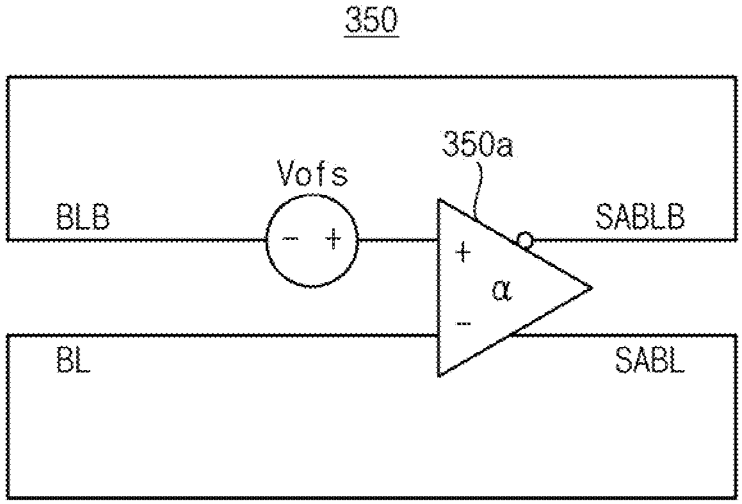
FIG. 18 is a diagram illustrating a model of a bitline sense amplifier in an offset compensation operation.

FIG. 18 is a diagram illustrating a model of a bitline sense amplifier in an offset compensation operation. The modeled bitline sense amplifier 350 in the offset compensation operation may include an amplifier 350*a* and an offset voltage source Vofs.

The negative output of the amplifier 350*a* is coupled to the negative voltage end of the offset voltage source Vofs. A positive input of the offset voltage source Vofs is connected to a positive input of the amplifier 350*a*. The positive output of the amplifier 350*a* is connected to the negative input of the amplifier 350*a*. In this case, the outputs of the amplifier 350*a* may correspond to sensing bitlines and complementary sensing bitlines SBL and SBLB, and the inputs of the amplifier 350*a* may correspond to bitlines BL and complementary bitlines BLB. For example, the offset voltage Vos refers to an offset of the first and second P-type transistors PM1 and PM2 and the first and second N-type transistors NM1 and NM2. In this case, the behavior of the equivalent circuit shown in FIG. 18 may be as shown as Expression 1.

$$V_{BL} + V_{OS} - V_{BLB} = \alpha(V_{SABL} - V_{SABLB}) \qquad \text{Expression 1}$$

$$\because (V_{BL} = V_{SABLB},\ V_{BLB} = V_{SABL})$$

$$V_{BL} - V_{BLB} = -V_{OS}\left(\frac{1}{1+\alpha}\right) \simeq -V_{OS}$$

Referring to Expression 1, VBL refers to the voltage on the bitline BL, Vos refers to the offset value of the bitline sense amplifier 350, VBLB refers to the voltage on the complementary bitline BLB, VSABL refers to the voltage on the sensing bitline SBL, VSABLB refers to the complementary sensing bitline SBLB, and a refers to the voltage gain of the amplifier 350*a*. As shown in Expression 1, the voltage difference between the bitline BL and the complementary bitline BL will approach the offset voltage Vos. In other words, the offset of the bitline sense amplifier 350 may be compensated for by the bitline BL being voltage level compensated by the offset Vos.

Due to the PVT variation, the threshold voltage of the first N-type transistor NM1 and the threshold voltage of the second N-type transistor NM2 may be different. In this case, it is assumed that the threshold voltage of the first N-type transistor NM1 is higher than the threshold voltage of the second N-type transistor NM2 by an offset voltage Vos. In this case, based on the aforementioned behavior of the modeled circuit in FIG. 18, the bitline BL will rise above the precharge voltage by the offset voltage Vos. In other words, the voltages on bitline BL and complementary bitline BLB will have a voltage difference equal to the offset voltage Vos. For example, the voltages of the bitlines and the complementary bitlines BL, BLB may be decreased by the threshold voltage of the transistors.

Therefore, since the voltage supplied to the gate electrode of the first N-type transistor NM1 and the voltage supplied to the gate electrode of the second N-type transistor NM2 are different from each other by an offset voltage Vos, the first and second N-type transistors N_1, N_2 have the same current characteristics. In other words, the offset noise of the bitline sense amplifier 350 may be reduced, such that a sufficient effective sensing margin of the bitline sense amplifier 350 may be secured even when the amount of voltage change ΔVBL (see FIG. 2) becomes small.

Figure 19:
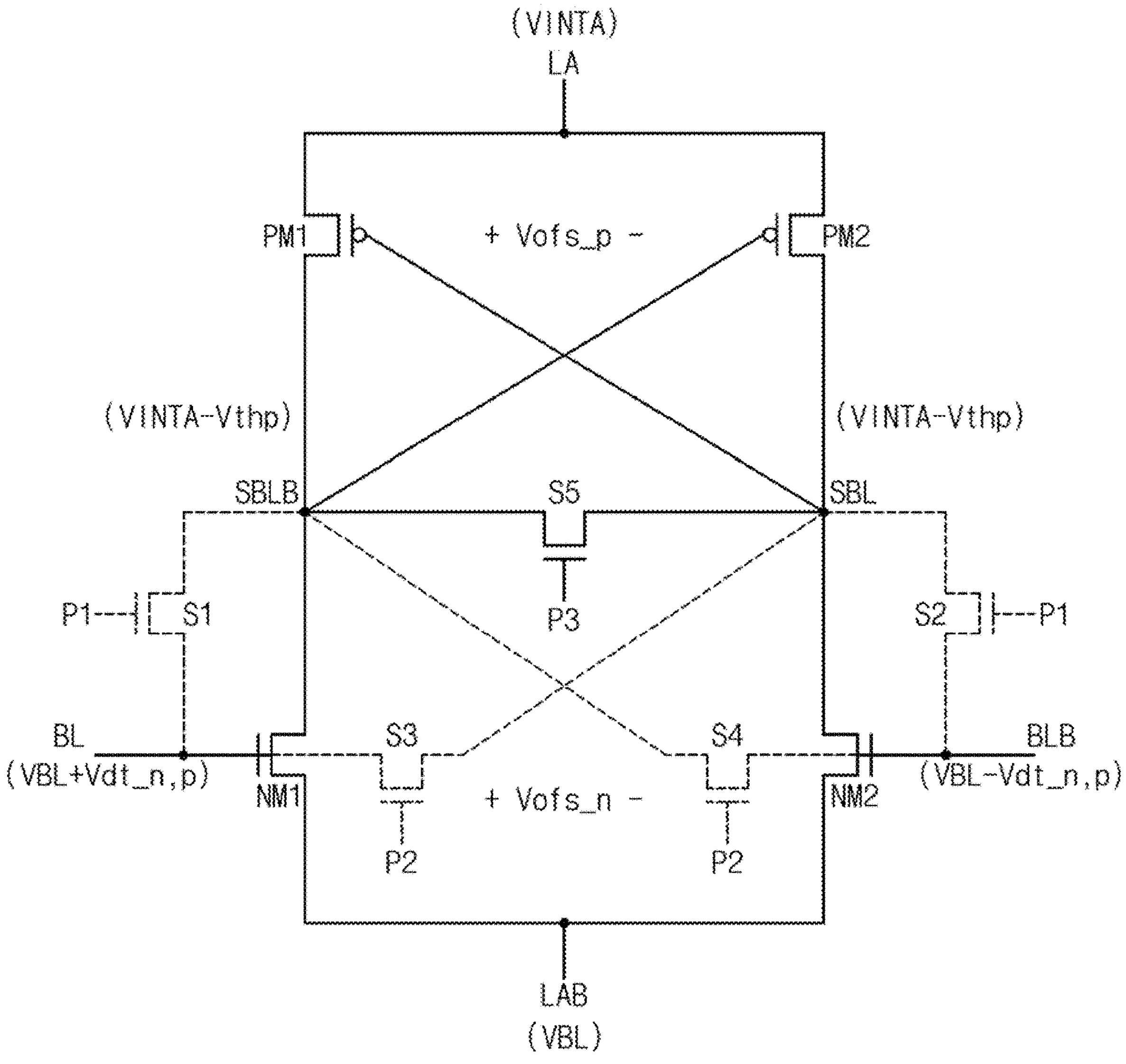
FIG. 19 is a diagram illustrating a sensing operation of the bitline sense amplifier of FIG. 13 in a first sensing period of FIG. 14.
Figure 20:
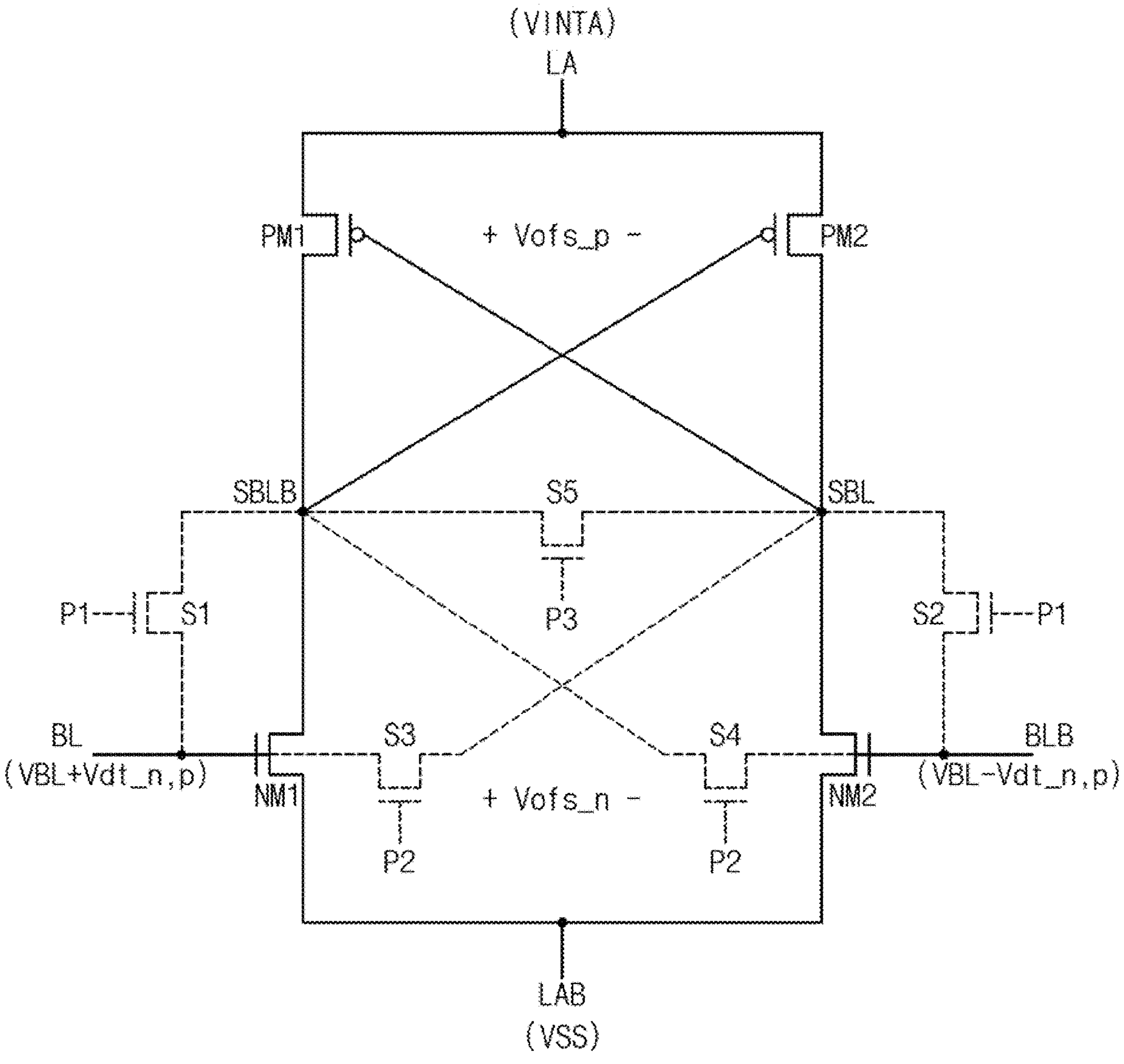
FIG. 20 is a diagram illustrating a sensing operation of the bitline sense amplifier of FIG. 13 in a second sensing period of FIG. 14.
Figure 21:
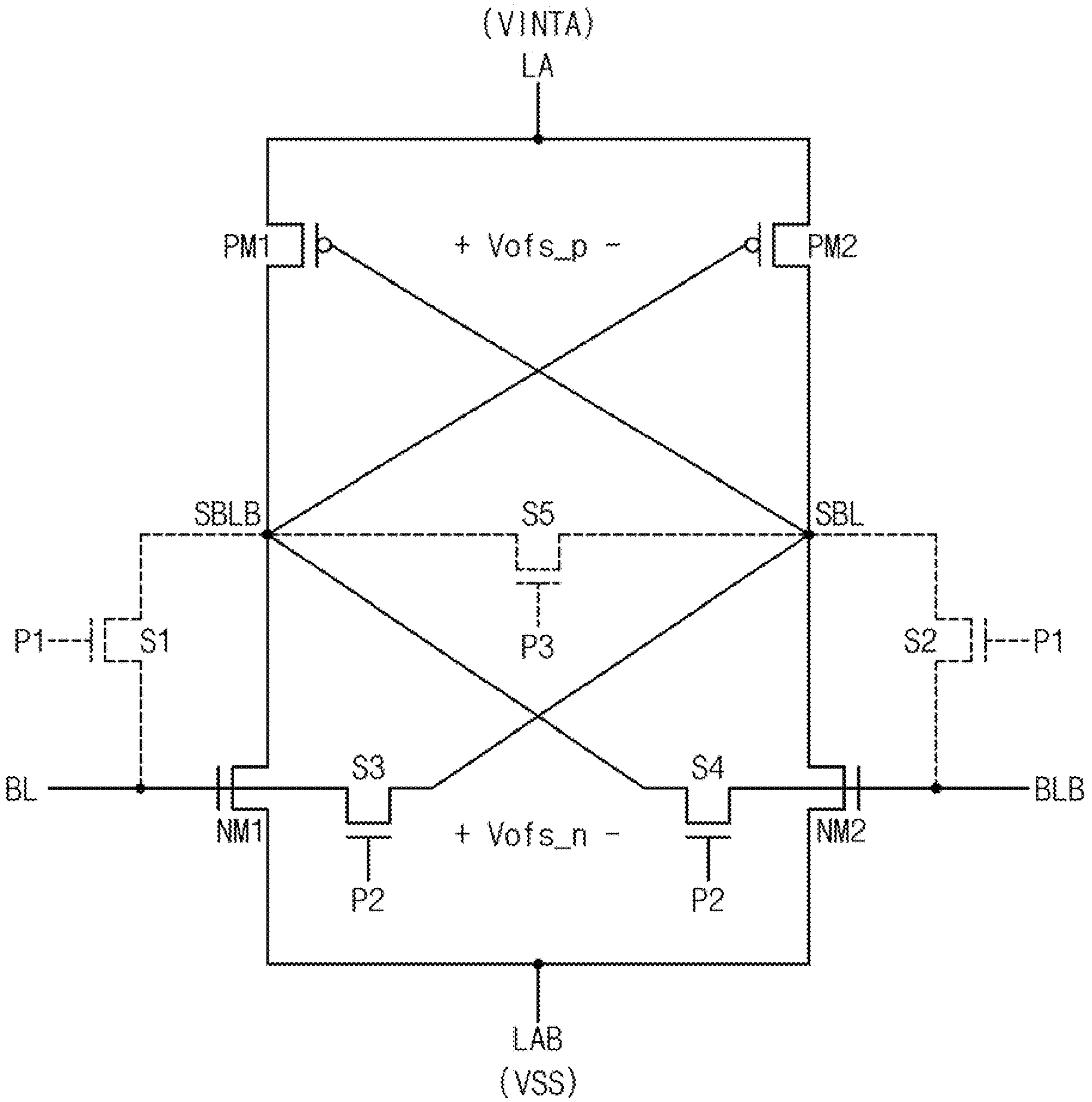
FIG. 21 is a diagram illustrating a sensing operation of the bitline sense amplifier of FIG. 13 in a third sensing period of FIG. 14.

FIG. 19 is a diagram illustrating a sensing operation of the bitline sense amplifier of FIG. 13 in a first sensing period of FIG. 14, FIG. 20 is a diagram illustrating a sensing operation of the bitline sense amplifier of FIG. 13 in a second sensing period of FIG. 14, and FIG. 21 is a diagram illustrating a sensing operation of the bitline sense amplifier of FIG. 13 in a third sensing period of FIG. 14.

Referring to FIGS. 13, 14, 19 to 21, the bitline sense amplifier 350 may increase the sensing ratio of the N-type sense amplifier over the P-type sense amplifier to improve sensing efficiency.

In the first sensing period SEN1 (see FIG. 19), for example, the first switching signal P1 and the second switching signal P2 may remain deactivated at a logic low level. Accordingly, the bitline BL may be electrically disconnected from the sensing bitline SBL and the complementary sensing bitline SBLB. The complementary bitline BLB may be electrically disconnected from the sensing bitline SBL and the complementary sensing bitline SBLB. The third switching signal P3 may remain activated at a high level. Accordingly, the sensing bitline SBL and the complementary sensing bitline SBLB may be equalized to the same voltage. The control line LA may be applied with a first internal voltage VINTA that is higher than the precharge voltage VBL. Accordingly, the sensing bitline SBL and the complementary sensing bitline SBLB may rise to a predetermined voltage (e.g., VINTA-Vthp, where Vthp is a threshold voltage of the first P-type transistor PM1 or the second P-type transistor PM2). The wordline WL may remain high during the bitline sensing operation.

In the second sensing period SEN2 (e.g., N-dominant sensing) (see FIG. 20), the bitline sense amplifier 350 may perform a pre-sensing operation. For example, the third switching signal P3 may be deactivated to a logic low level. Accordingly, the complementary sensing bitline SBLB and sensing bitline SBL may be electrically disconnected. The complementary control line LAB may be applied with a second internal voltage (e.g., the ground voltage VSS) that is lower than the precharge voltage VBL. In this case, the voltage of the complementary sensing bitline SBLB and the voltage of the sensing bitline SBL may have different voltage values based on the N-type sense amplifier (e.g., the first N-type transistor NM1 or the second N-type transistor NM2). In this case, the sensing ratio of the N-type sense amplifier may account for a first sensing ratio Vs_n, such as 90%. The sense ratio of the P-type sense amplifier may be a second sense ratio Vs_p (e.g., 10%). In one example, the first sense ratio Vs_n may be equal to the third offset compensation ratio Voc_n2 in the offset compensation operation as described with reference to FIGS. 15 through 17. The second sensing ratio Vs_p may be equal to the fourth offset compensation ratio Voc_p2 in the offset compensation operation as described with reference to FIGS. 15 through 17.

In the third sensing period SEN3 (see FIG. 21), the bitline sense amplifier 350 may perform a restoring-sensing operation. For example, the second switching signal P2 may be activated to a logic high level. Accordingly, the bitline BL and the sensing bitline SBLB may be electrically connected. The complementary bitline BLB and the complementary sensing bitline SBLB may be electrically connected. Thus, the bitline BL may be increased (or decreased) to the voltage level of the sensing bitline SBL. The complementary bitline BLB may be increased (or decreased) to the voltage level of the complementary sensing bitline SBLB. The bitline sense amplifier 350 may be connected to a data line after the first sensing period SEN1, and may output via the data line to an input/output circuit.

As described with reference to FIGS. 14, 19 through 21, the sense amplifier controller 200 may control the timing of the second switching signal P2 and the third switching signal P3 such that, in the normal temperature range RR of FIG. 4, the bitline sense amplifiers operate in the H-type sensing mode HTP. The sense amplifier controller 200 may activate the third switching signal P3 such that the sensing bitline SBL and the complementary sensing bitline SBLB are electrically connected in the charge sharing period CS. Further, the sense amplifier controller 200 may activate the second switching signal P2 such that the bitline BL and the sensing bitline SBL are electrically connected and the complementary bitline SBL and the complementary sensing bitline SBLB are electrically connected after the third switching signal P3 is deactivated during the sensing period SEN after the charge sharing period CS, for example, in the third sensing period SEN3.

As such, in the H-type sensing mode HTP, the sense amplifier controller 200 may activate the third switching signal P3 to turn on the fifth switching transistor S5 after the offset compensation is finished, deactivate the third switching signal P3 in the second sensing period SEN2 to turn off the fifth switching transistor S5, and activate the second switching signal P2 in the third sensing period SEN3 to turn on the third switching transistor S3 and the fourth switching transistor S4. With this H-type sensing mode HTP, the data pattern noise and the charge leakage noise may be effectively reduced simultaneously.

Figure 22:
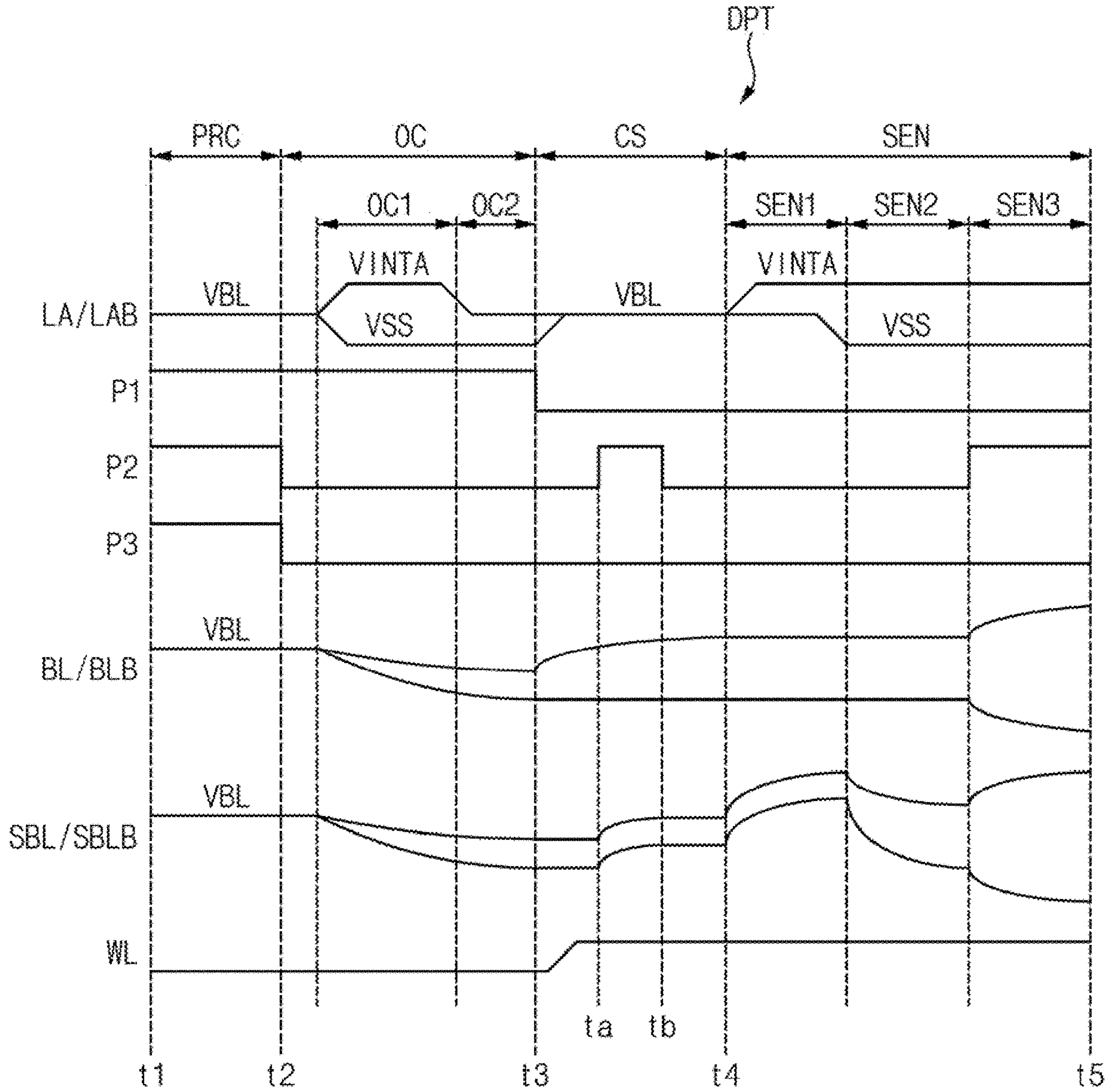
FIG. 22 is a timing diagram illustrating a D-type sensing mode of a bitline sense amplifier included in a semiconductor memory device according to one or more embodiments.

FIG. 22 is a timing diagram illustrating a D-type sensing mode of a bitline sense amplifier included in a semiconductor memory device according to one or more embodiments. Hereinafter, description that is redundant with FIGS. 14 through 21 will be omitted, and the description will focus on differences.

Referring to FIG. 22, the sense amplifier controller 200 may control the timing of the second switching signal P2 and the third switching signal P3 such that, in the low temperature range RC of FIG. 4, the bitline sense amplifiers operate in the D-type sensing mode DTP. The sense amplifier controller 200 may deactivate the third switching signal P3 such that the sensing bitline SBL and the complementary sensing bitline SBLB are electrically disconnected in the charge sharing period CS. Further, the sense amplifier controller 200 may toggle the second switching signal P2 such that the bitline BL and the sensing bitline SBL are electrically connected and the complementary bitline SBL and the complementary sensing bitline SBLB are electrically connected temporarily during the charge sharing period CS, for example, during the time interval ta~tb. As used herein, "toggling" a signal generally means to alternate between activated (e.g., logic high) and deactivated (e.g., logic low) states. Further, the sense amplifier controller 200 may activate the second switching signal P2 such that in the sensing period SEN after the charge sharing period CS, for example, in the third sensing period SEN3, the bitline BL and sensing bitline SBL are electrically connected and the complementary bitline SBL and complementary sensing bitline SBLB are electrically connected.

As such, in the D-type sensing mode DTP, the sense amplifier controller 200 toggles the second switching signal P2 during the charge sharing period CS to pass data information to the internal nodes of the bitline sense amplifier, that is, the sensing bitline SBL and the complementary sensing bitline SBLB, At the beginning of the sensing period SEN, for example, in the first sensing period SEN1 and the second sensing period SEN2, the second switching signal P2 may be deactivated to turn off the third switching transistor S3 and the fourth switching transistor S4 such that sensing by the voltages of the sensing bitline SBL and the complementary sensing bitline SBLB may be performed first. Then, in the third sensing period SEN3, the second switching signal P2 may be activated to turn on the third switching transistor S3 and the fourth switching transistor S4. This D-type sensing mode DTP enables a more effective reduction of the data pattern noise that prevails in the low temperature range RC.

Figure 23:
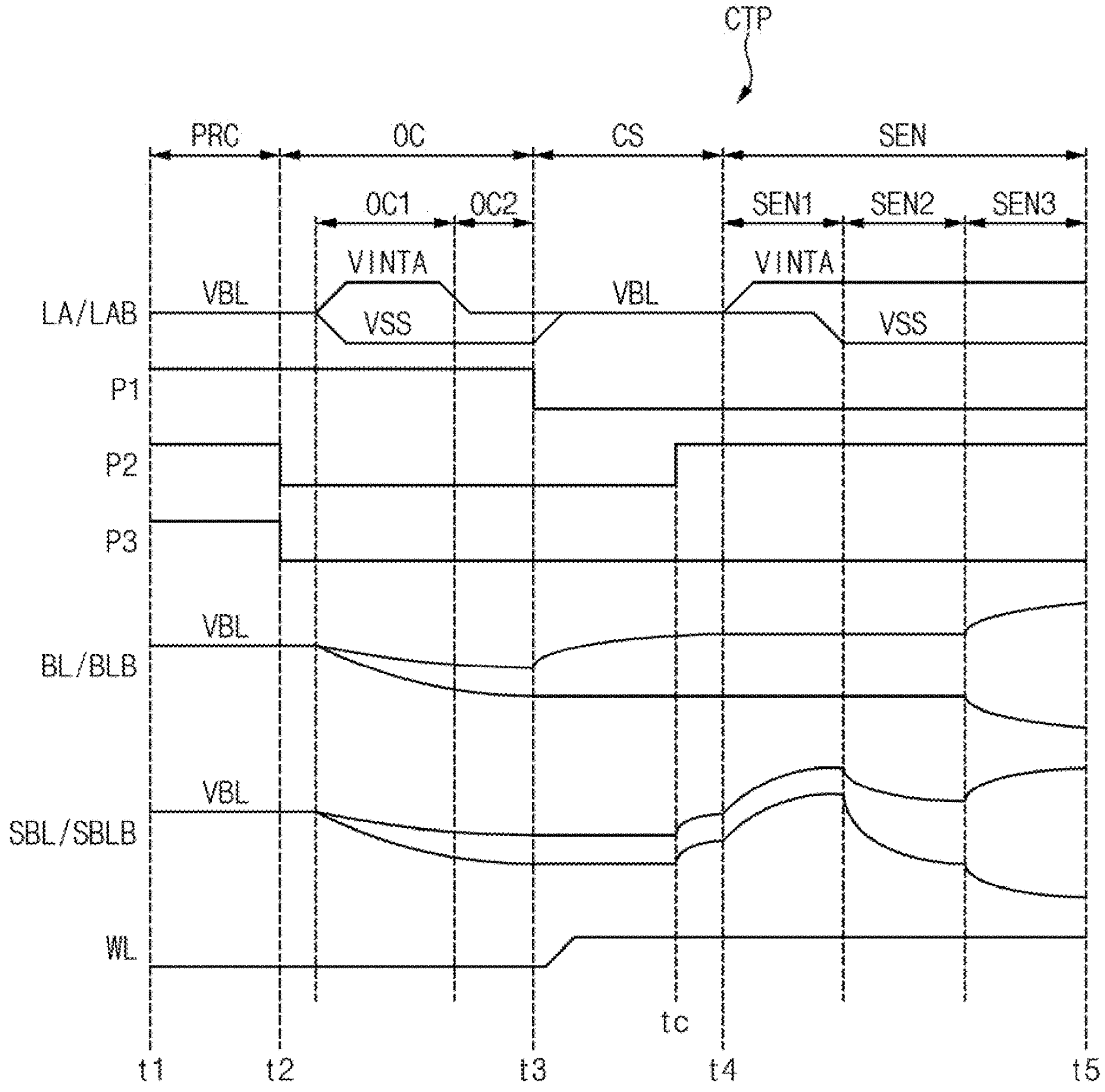
FIG. 23 is a timing diagram illustrating a C-type sensing mode of a bitline sense amplifier included in a semiconductor memory device according to one or more embodiments.

FIG. 23 is a timing diagram illustrating a C-type sensing mode of a bitline sense amplifier included in a semiconductor memory device according to one or more embodiments. Hereinafter, description that is redundant with FIGS. 14 through 21 will be omitted, and the description will focus on differences.

Referring to FIG. 23, the sense amplifier controller 200 may control the timing of the second switching signal P2 and the third switching signal P3 such that, in the high temperature range RH of FIG. 4, the bitline sense amplifiers operate in a C-type sensing mode. The sense amplifier controller 200 may deactivate the third switching signal P3 such that the sensing bitline SBL and the complementary sensing bitline SBLB are electrically disconnected in the charge sharing period CS. Further, the sense amplifier controller 200 may activate the second switching signal P2 in advance such that the bitline BL and the sensing bitline SBL are electrically connected and the complementary bitline SBL and the complementary sensing bitline SBLB are electrically connected prior to the sensing period SEN, for example, at a time point tc during the charge sharing period CS.

In this way, in the C-Type sensing mode CTP, the second switching signal P2 may be activated in advance of the sensing period SEN to turn on the third switching transistor S3 and the fourth switching transistor S4 to operate the bitline sense amplifier as a cross-couple latch. In this C-type sensing mode CTP, characteristic degradation due to charge leakage from the internal nodes SBL and SBLB through the N-type sense amplifiers NM1 and NM2 may be prevented or reduced.

Figure 24:
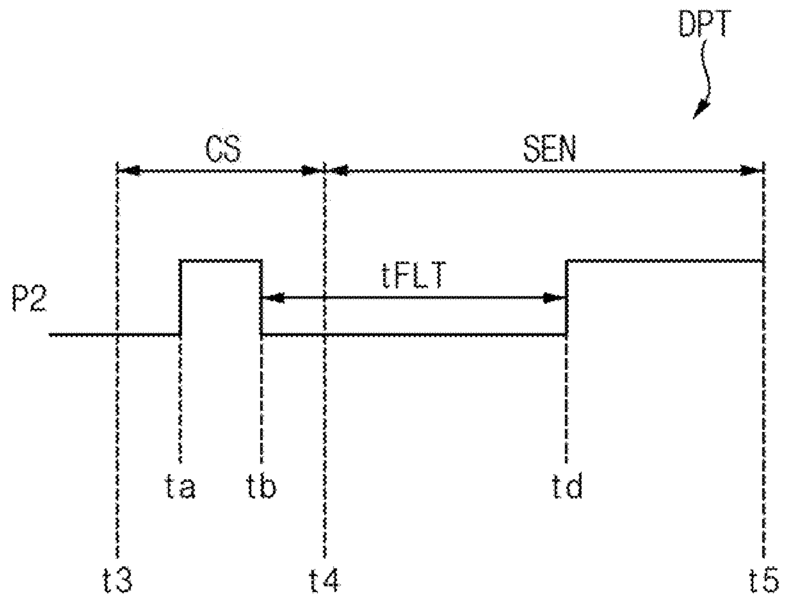
FIG. 24 is a diagram illustrating floating time in the D-type sensing mode of a semiconductor memory device according to one or more embodiments.
Figure 25:
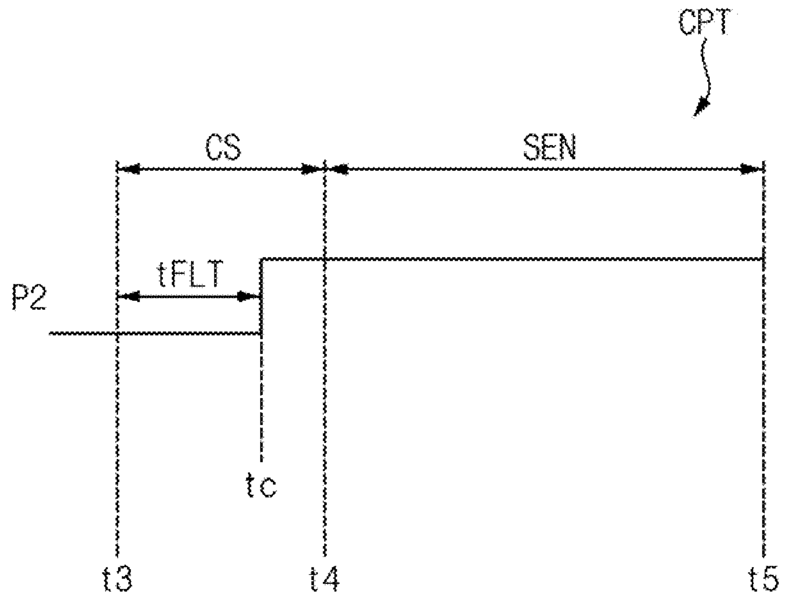
FIG. 25 is a diagram illustrating floating time in the C-type sensing mode of a semiconductor memory device according to one or more embodiments.

FIG. 24 is a diagram illustrating floating time in the D-type sensing mode of a semiconductor memory device according to one or more embodiments, and FIG. 25 is a diagram illustrating floating time in the C-type sensing mode of a semiconductor memory device according to one or more embodiments. FIGS. 24 and 25 illustrate portions of the charge sharing period CS and the sensing period SEN of the second switching signal P2 shown in the timing diagrams of FIGS. 22 and 23.

Referring to FIGS. 24 and 25, a floating time tFLT may be defined as the time interval while the sensing bitline SBL and the complementary sensing bitline SBLB are floated in the charge sharing period CS and the sensing period SEN.

For example, as shown in FIG. 24, in the D-type sensing mode DTP, the floating time tFLT may be defined as the time interval between a time point tb when the second switching signal P2 is deactivated after toggling in the charge sharing period CS and a time point td when the second switching signal P2 is reactivated in the sensing period SEN.

For example, in the C-type sensing mode CTP, as shown in FIG. 25, the floating time tFLT may be defined as the time interval between the start time point t3 of the charge sharing period CS and the time point tc when the second switching signal P2 is activated in the charge sharing period CS.

Figure 26:
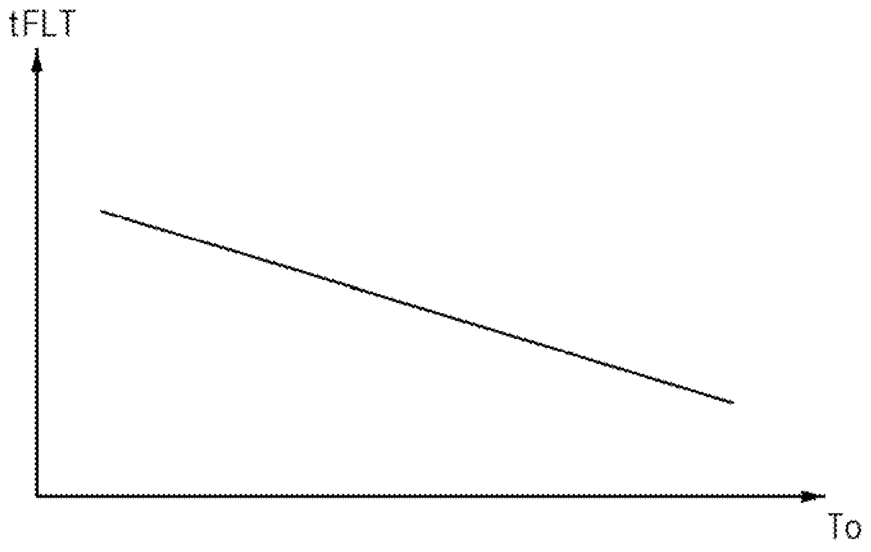
FIGS. 26 and 27 are graphs illustrating control of a floating time in a semiconductor memory device according to one or more embodiments.
Figure 27:
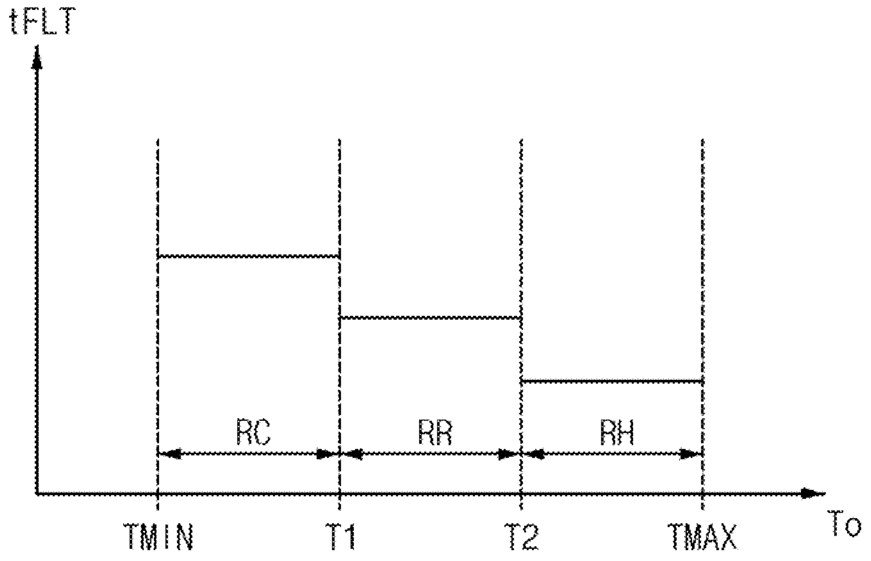

FIGS. 26 and 27 are diagrams illustrating a floating time in a semiconductor memory device according to one or more embodiments.

Referring to FIGS. 24, 25, 26, and 27, the timing of switching signals, such as the second switching signal P2, may be controlled such that the floating time tFLT while the sensing bitline SBL and complementary sensing bitline SBLB are floated decreases as the operation temperature To increases.

In an embodiment, the sense amplifier controller 200 may further delay the time point tb at which the second switching signal P2 is deactivated after toggling in the charge sharing period CS as the operation temperature To increases, such that the floating time tFLT decreases as the operation temperature To increases, in the D-type sensing mode DTP of FIG. 24.

In an embodiment, the sense amplifier controller 200 may further advance the time point tc at which the second switching signal P2 is activated in the charge sharing period CS as the operation temperature To increases, such that the floating time tFLT decreases as the operation temperature To increases, in the C-type sensing mode CTP of FIG. 25.

In an embodiment, as shown in FIG. 27, the sense amplifier controller 200 may divide the operation temperature To into a plurality of temperature ranges RC, RR, and RH, and control the timing of the plurality of switching signals such that the floating time tFLT changes depending on the plurality of temperature ranges RC, RR, and RH. For example, as described with reference to FIG. 4, the operation temperature To of the semiconductor memory device may be divided into the low temperature range RC between the minimum temperature TMIN and the first temperature T1, the normal temperature range RR between the first temperature T1 and the second temperature T2, and the high temperature range RH between the second temperature T2 and the maximum temperature TMAX.

Figure 28:
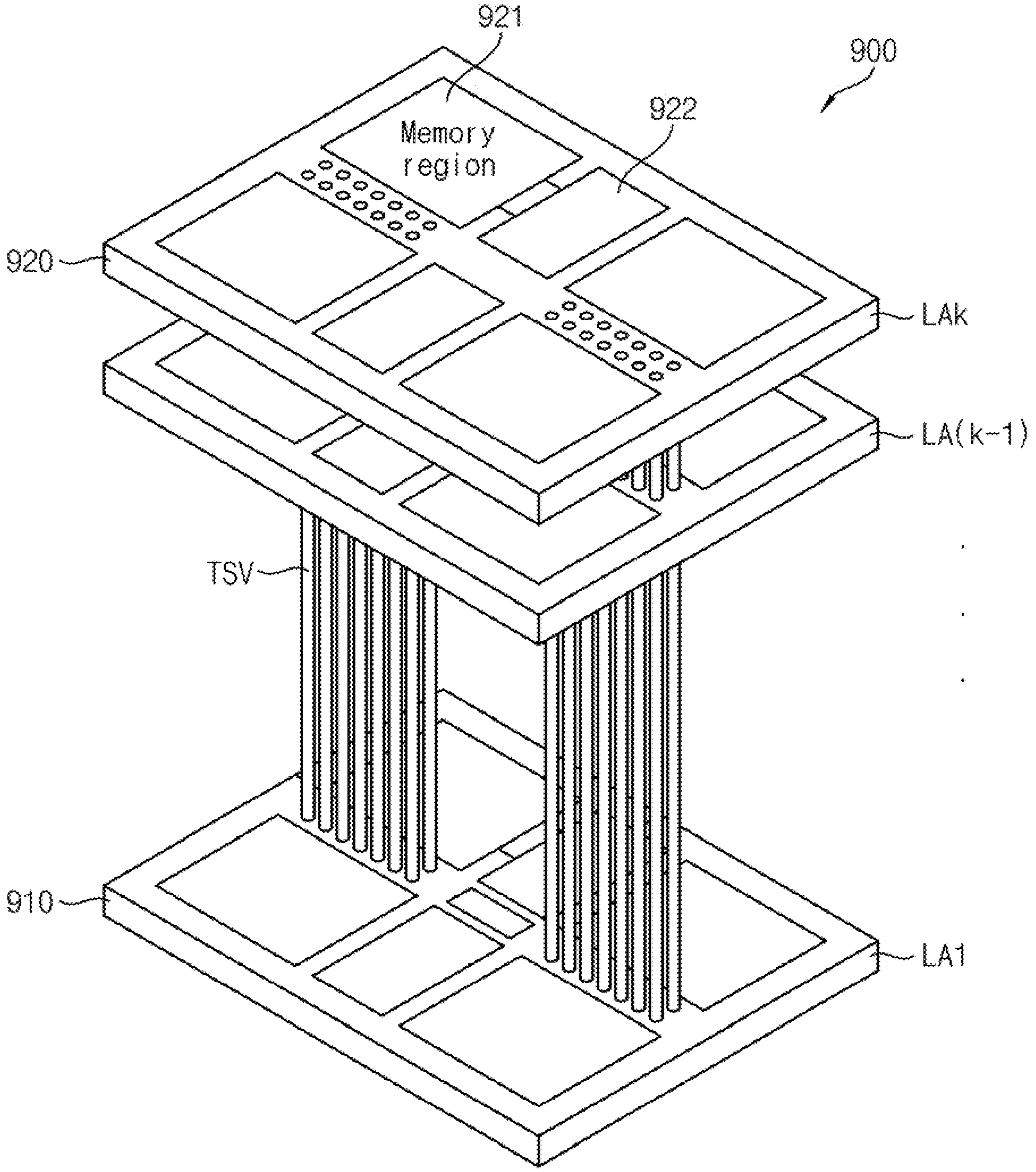
FIGS. 28 and 29 are diagrams illustrating a stacked memory device according to one or more embodiments.
Figure 29:
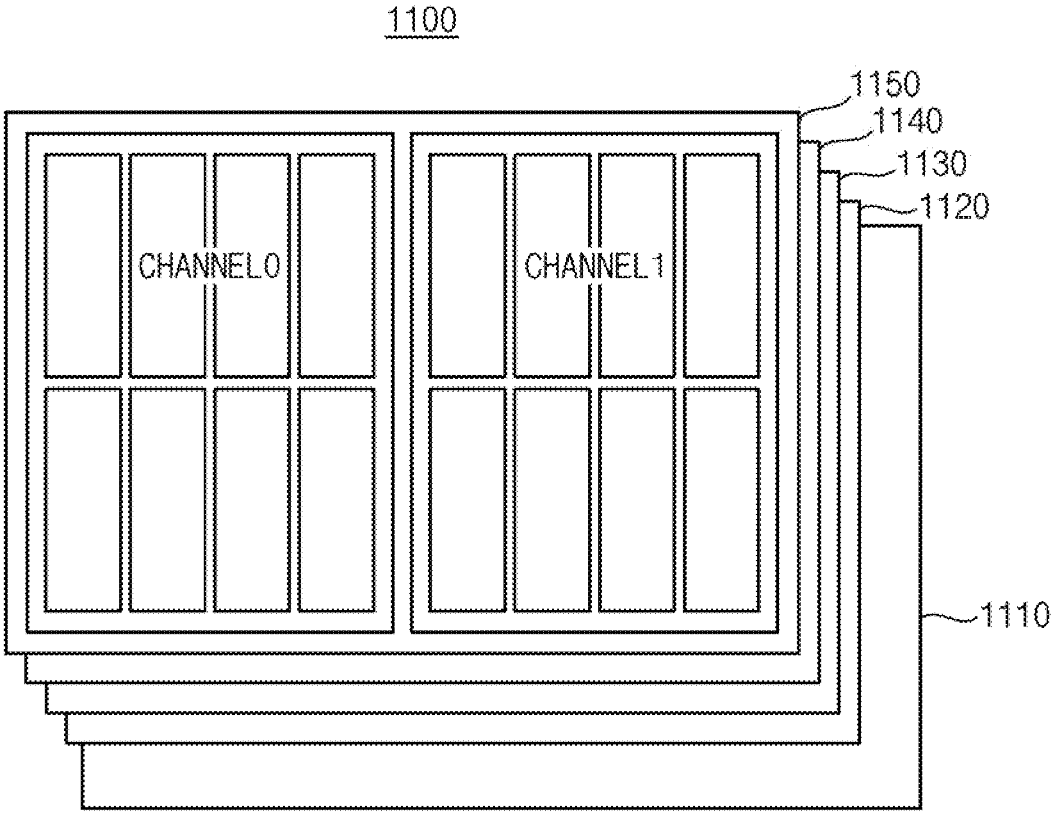

FIGS. 28 and 29 are diagrams illustrating a stacked memory device according to one or more embodiments.

Referring to FIG. 28, a semiconductor memory device 900 may include first through kth semiconductor integrated circuit layers LA1 (9100 through LAk (920), in which the lowest, first semiconductor integrated circuit layer LA1 is assumed to be an interface or control chip, and the other semiconductor integrated circuit layers LA2 through LAk are assumed to be slave chips including core memory chips. The slave chips may form a plurality of memory ranks.

The first through kth semiconductor integrated circuit layers LA1 through LAk may transmit and receive signals between the layers by through-substrate vias TSVs (e.g., through-silicon vias). The lowest first semiconductor integrated circuit layer LA1, as the interface or control chip, may communicate with an external memory controller through a conductive structure formed on an external surface.

Each of the first semiconductor integrated circuit layer LA1 910 through the kth semiconductor integrated circuit layer LAk 920 may include memory regions 921 and peripheral circuits 922 for driving the memory regions 921. For example, the peripheral circuits 922 may include a row-driver for driving wordlines of a memory, a column-driver for driving bitlines of the memory, a data input-output circuit for controlling input-output of data, a command buffer for receiving a command from an outside source and buffering the command, and an address buffer for receiving an address from an outside source and buffering the address.

The first semiconductor integrated circuit layer LA1 910 may further include a control circuit. The control circuit may control access to the memory region 921 based on a command and an address signal from a memory controller and may generate control signals for accessing the memory region 921.

The first semiconductor layer 910 may include a temperature measurement circuit and a sense amplifier controller according to one or more embodiments. As described above, the sense amplifier controller may control the operation timing of the bitline sense amplifiers to reduce the sensing noises according to the operation temperature based on the temperature code indicating the operation temperature.

FIG. 29 illustrates an example high bandwidth memory (HBM) organization. Referring to FIG. 29, a HBM 1100 may have a stack of multiple DRAM semiconductor dies 1120, 1130, 1140, and 1150. The HBM of the stack structure may be optimized by a plurality of independent interfaces, i.e., channels. Each DRAM stack may support up to 8 channels in accordance with HBM standards. FIG. 29 shows an example stack containing 4 DRAM semiconductor dies 1120, 1130, 1140, and 1150, and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 1100 may further include an interface die 1110 or a logic die at bottom of the stack structure to provide signal routing and other functions. Some functions for the DRAM semiconductor dies 1120, 1130, 1140, and 1150 may be implemented in the interface die 1110.

According to one or more embodiments, the high bandwidth memory 1100 may include a temperature measurement circuit and a sense amplifier controller as described above. The sense amplifier controller may control the operation timing of the bitline sense amplifier to reduce the sensing noises according to the operation temperature based on the temperature code indicating the operation temperature.

Figure 30:
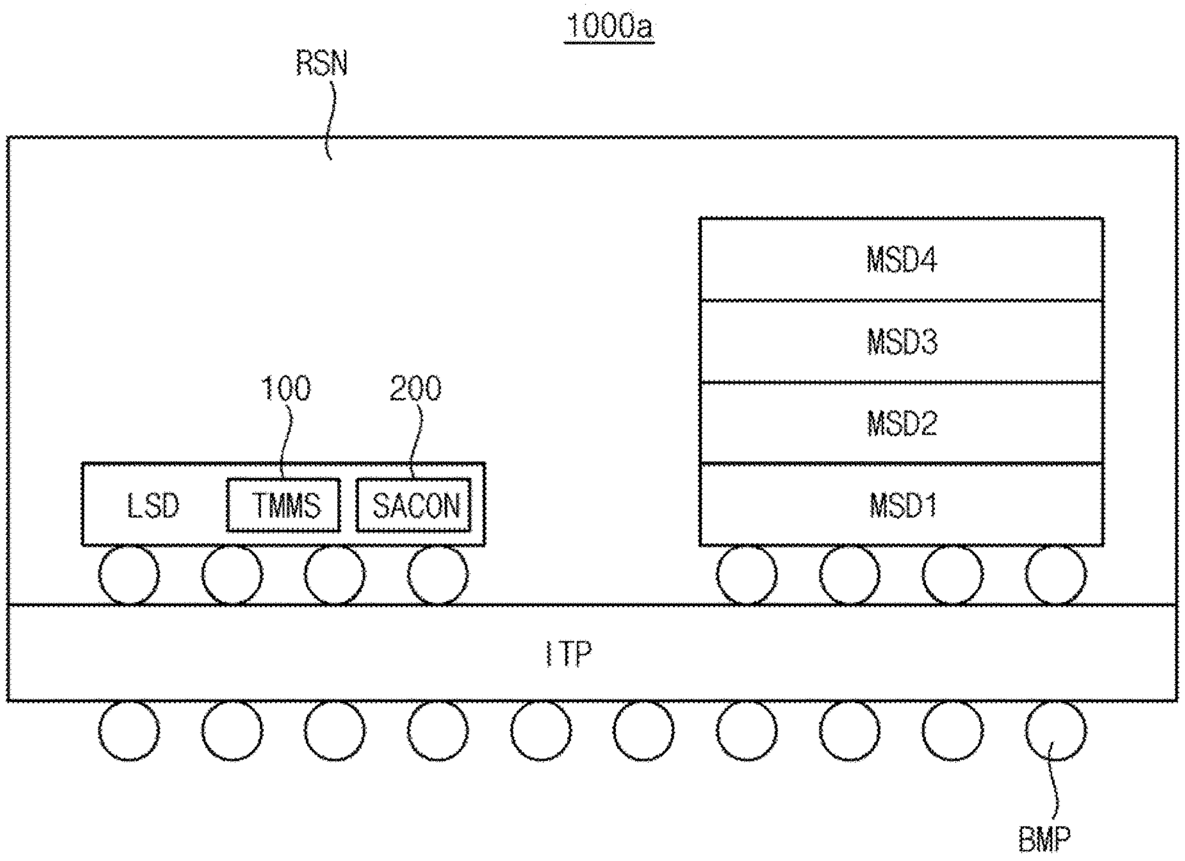
FIGS. 30 and 31 are diagrams illustrating packaging structures of a stacked memory device according to one or more embodiments.
Figure 31:
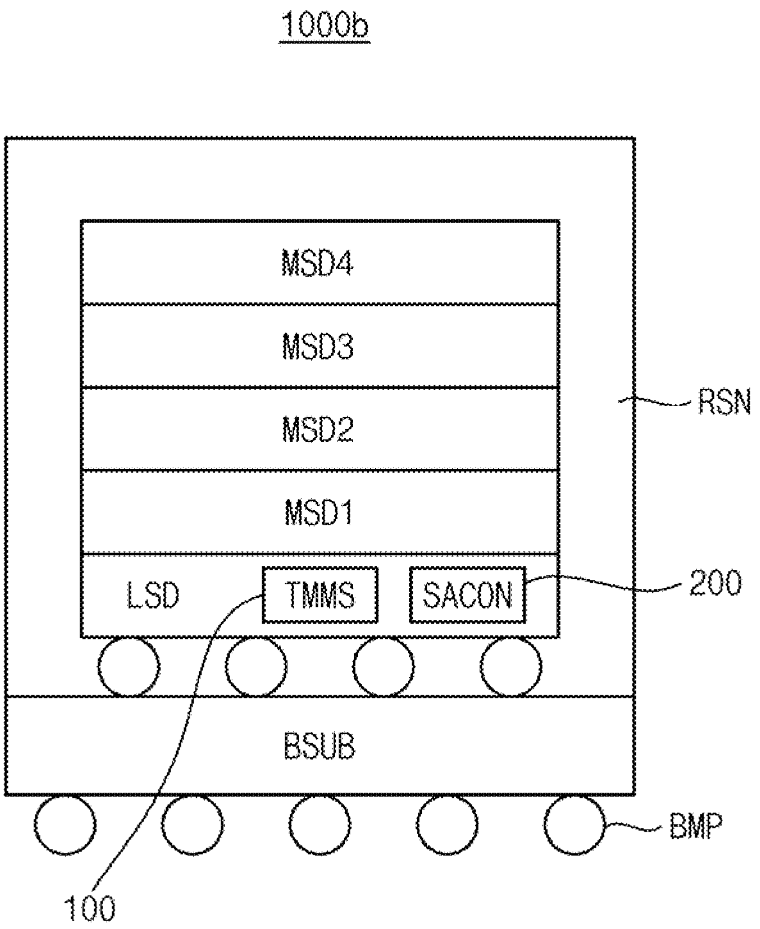

FIGS. 30 and 31 are diagrams illustrating packaging structures of a stacked memory device according to one or more embodiments.

Referring to FIG. 30, a memory device 1000*a* may be a memory package, and may include a base substrate or an interposer ITP and a stacked memory device stacked on the interposer ITP. The stacked memory device may include a logic semiconductor die LSD (or a buffer semiconductor die) and a plurality of memory semiconductor dies MSD1, . . . , MSD4.

Referring to FIG. 31, a memory device 1000*b* may be a memory package and may include a base substrate BSUB and a stacked memory device stacked on the base substrate BSUB. The stacked memory device may include a logic semiconductor die LSD and a plurality of memory semiconductor dies MSD1, . . . , MSD4.

FIG. 30 illustrates a structure in which the memory semiconductor dies MSD1, . . . , MSD4 except for the logic semiconductor die LSD are stacked vertically and the logic semiconductor die LSD is electrically connected to the memory semiconductor dies MSD1, . . . , MSD4 through the interposer ITP or the base substrate. In contrast, FIG. 31 illustrates a structure in which the logic semiconductor die LSD is stacked vertically with the memory semiconductor dies MSD1, . . . , MSD4.

The buffer semiconductor die LSD may include a temperature measurement circuit TMMS 100 and a sense amplifier controller SACON 200 as described above. According to one or more embodiments, the temperature measurement circuit 100 may be integrated into at least one of the memory semiconductor dies MSD1 to MSD4.

The temperature measurement circuit 100 may measure the operation temperature of the stacked memory device and generate the temperature code corresponding to the operation temperature. Based on the temperature code, the sense amplifier controller 200 may control the timing of the plurality of switching signals to reduce the sensing noises of the plurality of bitline sense amplifiers according to the operation temperature.

The base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB. In one or more embodiments, the semiconductor dies LSD and MSD1, . . . , MSD4 may be electrically connected through through-silicon vias. In other example embodiments, the semiconductor dies LSD and MSD1, . . . , MSD4 may be electrically connected through the bonding wires. In still other example embodiments, the semiconductor dies LSD and MSD1, . . . , MSD4 may be electrically connected through a combination of the through-silicon vias and the bonding wires. In the example embodiment of FIG. 25, the logic semiconductor die LSD may be electrically connected to the memory semiconductor dies MSD1, . . . , MSD4 through conductive line patterns formed in the interposer ITP. The stacked semiconductor dies LSD and MSD1, . . . , MSD4 may be packaged using an encapsulant such as resin RSN.

Figure 32:
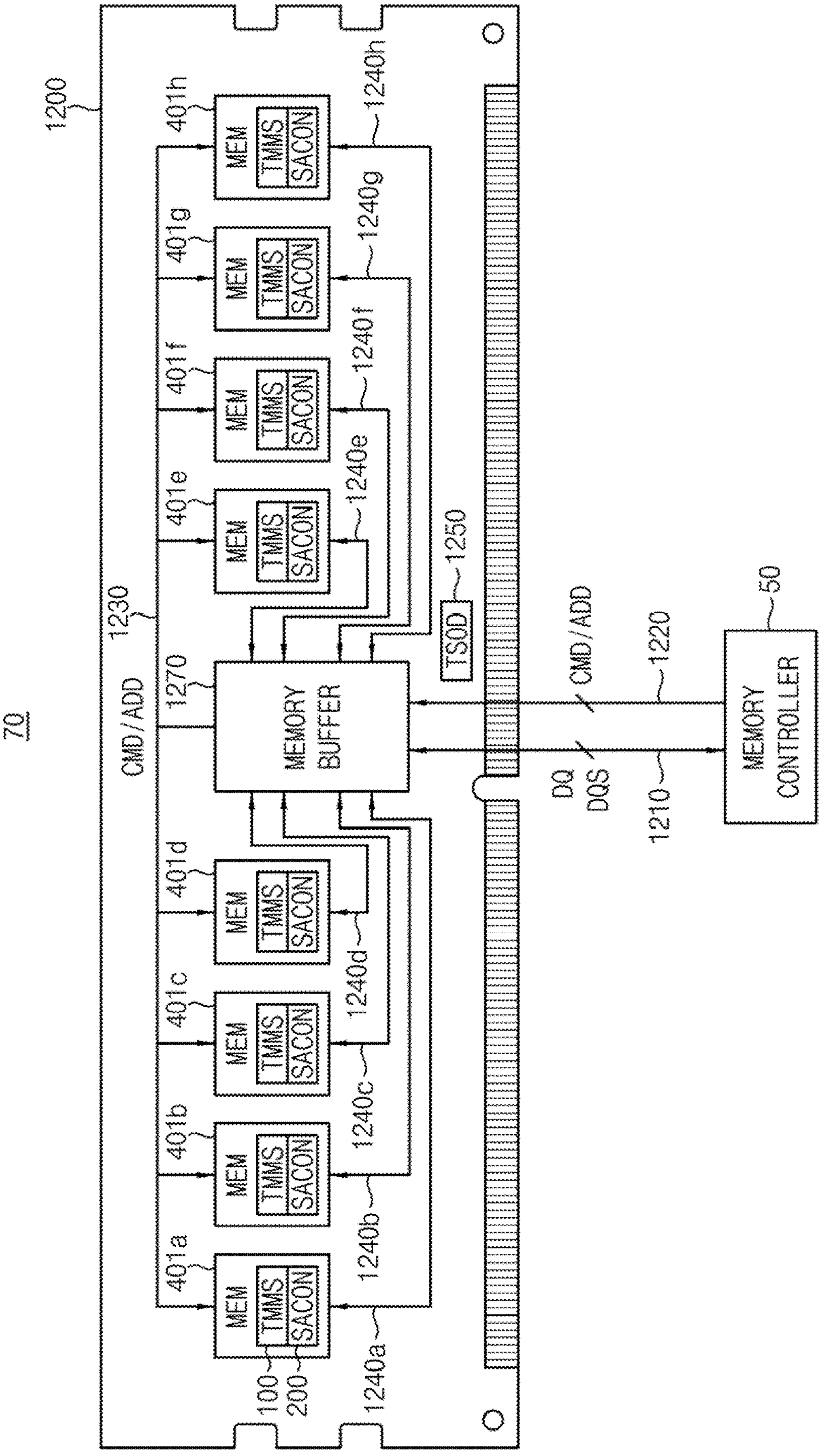
FIG. 32 is a diagram illustrating a memory system according to one or more embodiments.

FIG. 32 is a diagram illustrating a memory system according to one or more embodiments.

As illustrated in FIG. 32, a memory systems 70 may include a memory module 1200 and a memory controller 50. The memory module 1200 may include a module substrate and a plurality of memory chips 401*a*, 401*b*, 401*c*, 401*d*, 401*e*, 401*f*, 401*g*, 401*h* and a module sensor TSOD 1250 that are mounted on the module substrate. FIG. 32 illustrates a non-limiting example of eight memory chips 401*a*, . . . , 401*h*, however the number of memory chips included in the memory module 1200 may be determined variously.

Referring to FIG. 32, the memory module 1200 may be connected to the memory controller 50 via a data bus 1210 and a control bus 1220. The memory module 1200 may be inserted into a socket connector of a larger memory system or computational system. Electric connectors (or pins) of the memory module 1200 may be connected to electric contacts of the socket connector. The electric connectors and the buses 1210 and 1220 connected to the electric contacts allow direct access to a memory buffer or a buffer chip 1270 and indirect access to the memory chips 401*a*, . . . , 401*h* of the memory module 1200. The data bus 1210 may include signal lines (conductive wiring) to transfer data signals DQ and data strobe signals DQS, and the control bus 1220 includes at least one of a command (CMD) line and/or address (ADD) line.

The data bus 1210 and control bus 1220 are directly connected to the buffer chip 1270 via the respective socket/pin and bus signal line arrangements. In turn, the buffer chip 1270 is connected to the respective memory chips 401*a*, . . . , 401*h* via at least a commonly-connected first bus 1230 and separately connected second buses 1240*a*, 1240*b*, 1240*c*, 1240*d*, 1240*e*, 1240*f*, 1240*g*, 1240*h* from specified ports of the buffer chip 1270 to corresponding ports of the memory chips 401*a*, . . . , 401*h*. The buffer chip 1270 may be used to transfer a received command and/or address received from the memory controller 50 via the control bus 1220 to the respective memory chips 401*a*, . . . , 401*h* via the first bus 1230.

The buffer chip 1270 may transfer write data DQ (i.e., data to be written to one or more of the memory chips 400*a*, . . . , 400*h*) and the data strobe signal DQS received from the memory controller 50 via the data bus 1210 to the memory chips 401*a*, . . . , 401*h* via the respective second buses 1240*a*, . . . , 1240*h*. Alternately, the buffer chip 1270 may transfer read data DQ (data retrieved from one or more of the memory chips 401*a*, . . . , 401*h*) obtained from one or more of the memory chips 401*a*, . . . , 401*h* via the second buses 1240*a*, . . . , 1240*h* to the memory controller 50 via the data bus 1210.

Each of the memory chips 401*a*~401*h* may include a temperature measurement circuit TMMS 100 and a sense amplifier controller SACON 200 as described above. The temperature measurement circuit 100 may measure the operation temperature of the stacked memory device and generate the temperature code corresponding to the operation temperature. Based on the temperature code, the sense amplifier controller 200 may control the timing of the plurality of switching signals to reduce the sensing noises of the plurality of bitline sense amplifiers according to the operation temperature.

Figure 33:
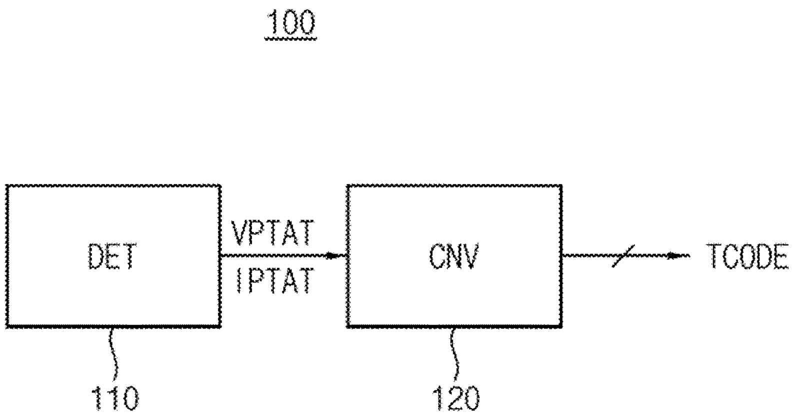
FIG. 33 is a block diagram illustrating a temperature measurement circuit included in a semiconductor memory device according to one or more embodiments.
Figure 34:
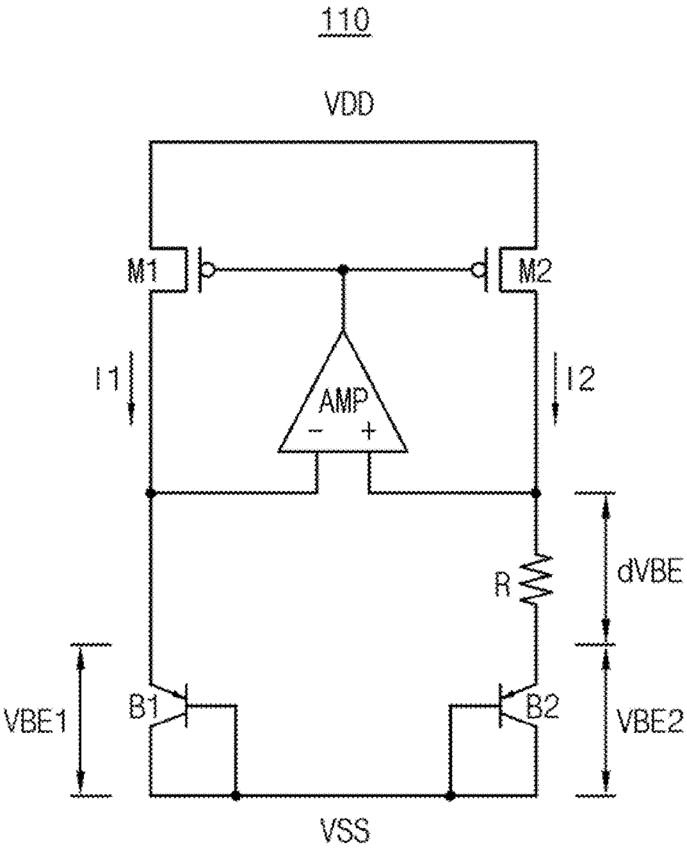
FIG. 34 is a circuit diagram illustrating a temperature detector included in the temperature measurement circuit of FIG. 33.

FIG. 33 is a block diagram illustrating an example embodiment of a temperature measurement circuit included in a semiconductor memory device according to one or more embodiments, and FIG. 34 is a circuit diagram illustrating an example embodiment of a temperature detector included in the temperature measurement circuit of FIG. 33. The temperature measurement circuit of FIGS. 33 and 34 is only an example, and the configuration of the temperature measurement circuit may be changed in various ways.

Referring to FIG. 33, a temperature measurement circuit 100 may include a temperature detector DET 110 and an analog-to-digital convertor CNV 120. The temperature detector 110 may output at least one of a voltage signal VPTAT and a current signal IPTAT proportional to the operation temperature To. The analog-to-digital converter 120 may convert the output of the temperature detector 110 to a digital signal to generate a temperature code TCODE of multiple bits.

In one or more embodiments, the temperature detector 110 may be implemented with first and second PMOS transistors M1 (with current I1), M2 (with current I2), a feedback amplifier AMP, a resistor R and first and second bipolar transistors B1, B2, which are connected between a power supply voltage VDD and a ground voltage VSS as represented in FIG. 34. A voltage dVBE across the resistor R may be obtained as Expression 2.

$$dVBE = VBE1 - VBE2 = VT * \mathrm{Ln}(Ic1/Is1) - VT * \mathrm{Ln}(n * Ic2/Is2) = VT * \mathrm{Ln}(n) \quad \text{Expression 2}$$

In Expression 2, Is1 and Is2 indicate reverse saturation currents of the bipolar transistors B1, B2. Also, Ic1 and Ic2 indicate currents flowing through the bipolar transistors B1, B2. Additionally, n is a gain ratio of the bipolar transistors B1, B2, and VT indicates a temperature voltage that is proportional to an absolute temperature of the temperature detector 110. Ln (n) is a constant value and thus the voltage dVBE across the resistor R and the current I2 flowing through the resistor R are proportional to the temperature variation. The voltage signal VPTAT and the current signal IPTAT may be generated as an output based on the voltage dVBE and the current I2 proportional to the operational temperature.

The on-chip temperature sensor described with reference to FIGS. 33 and 34 may be integrated in the same semiconductor die of the semiconductor memory device, and the on-chip temperature sensor is distinct from an external temperature sensor such as a TSOD that is disposed at the memory module. Using the temperature measurement circuit 100, the operation temperature To of the semiconductor memory device may be measured accurately.

Figure 35:
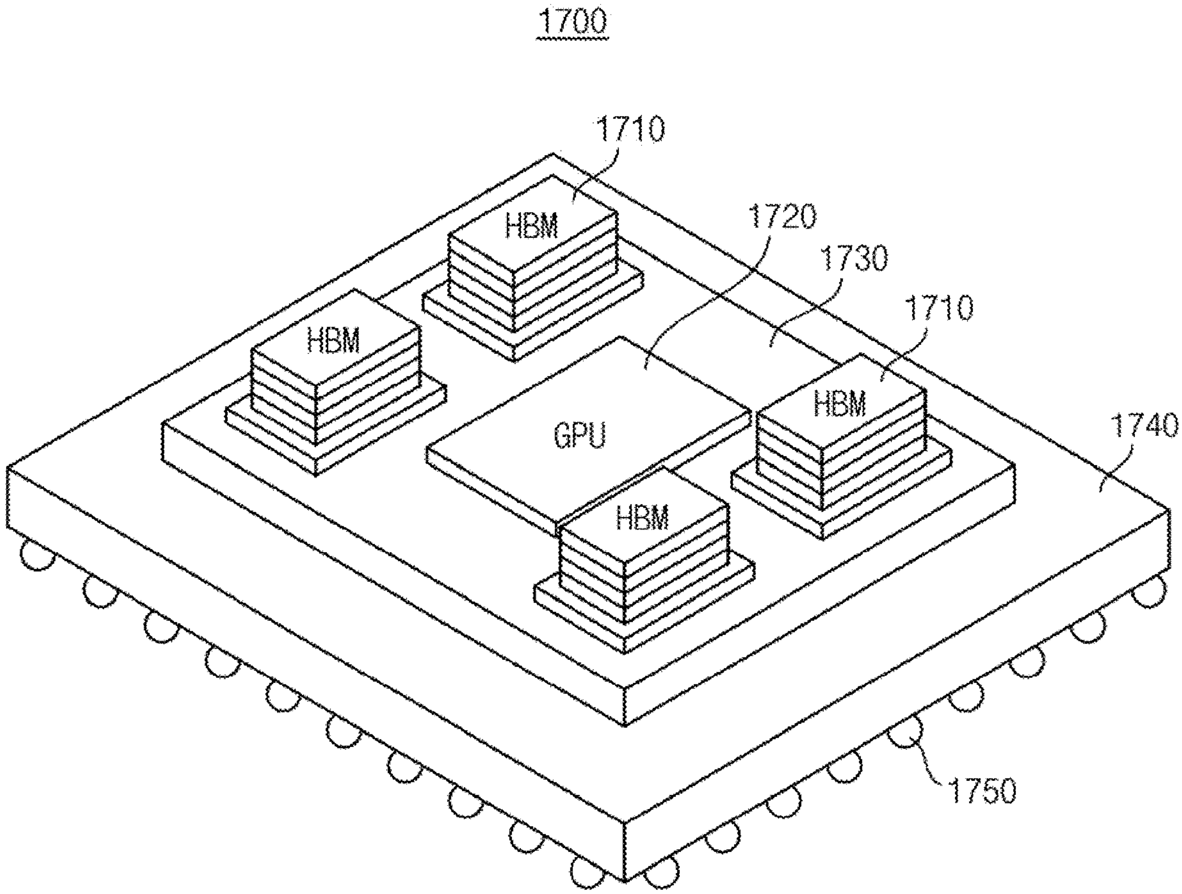
FIG. 35 is a diagram illustrating a semiconductor package including a stacked memory device according to one or more embodiments.

FIG. 35 is a diagram illustrating a semiconductor package including a stacked memory device according to one or more embodiments.

Referring to FIG. 35, a semiconductor package 1700 may include one or more stacked memory devices 1710 and a graphics processing unit (GPU) 1720.

The stacked memory devices 1710 and the GPU 1720 may be mounted on an interposer 1730, and the interposer on which the stacked memory device 1710 and the GPU 1720 are mounted may be mounted on a package substrate 1740. The package substrate 1740 is mounted on solder balls 1750. The GPU 1720 may perform the same operation as the memory controller as described above or may include the memory controller. The GPU 1720 may store data, which is generated or used in graphic processing in the stacked memory devices 1710.

The stacked memory device 1710 may be implemented in various forms, and the stacked memory device 1710 may be a memory device in a high bandwidth memory (HBM) form in which a plurality of layers are stacked. The stacked memory device 1710 may include a buffer die and a plurality of memory dies.

Figure 36:
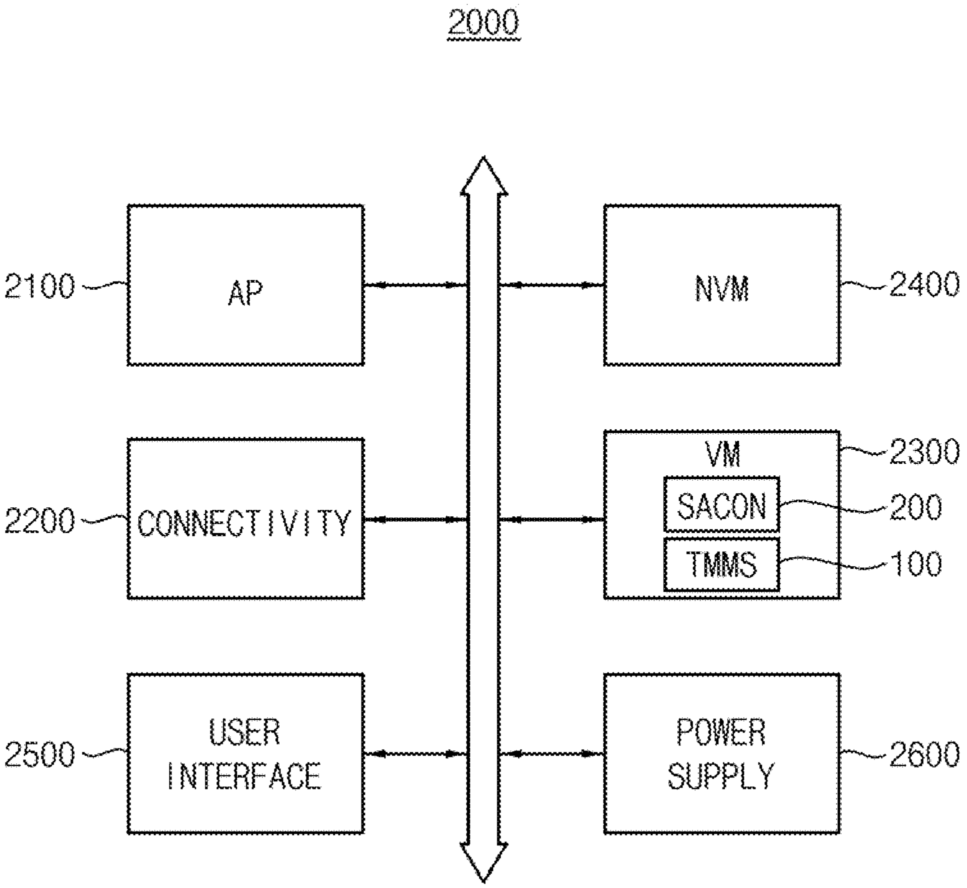
FIG. 36 is a block diagram illustrating a mobile system according to one or more embodiments.

FIG. 36 is a block diagram illustrating a mobile system according to one or more embodiments.

Referring to FIG. 36, a mobile system 2000 may include an application processor (AP) 2100, a connectivity unit 2200, a volatile memory device (VM) 2300, a nonvolatile memory device (NVM) 2040, a user interface 2500, and a power supply 2600. In one or more embodiments, the mobile system 2000 may be, for example, a mobile phone, a smart phone, a personal digital assistant (PDA), a portable multimedia player (PMP), a digital camera, a music player, a portable game console, a navigation system, or another type of electronic device.

The application processor 2100 may execute applications, e.g., a web browser, a game application, a video player, and so on. The connectivity unit 2200 may perform wired or wireless communication with an external device. The volatile memory device 2300 may store data processed by the application processor 2100 or may operate as a working memory. The nonvolatile memory device 2400 may store a boot image for booting the mobile system 2000. The user interface 2500 may include at least one input device, such as a keypad, a touch screen, etc., and at least one output device, such as a speaker, a display device, etc. The power supply 2600 may supply a power supply voltage to the mobile system 2000.

The semiconductor memory device 2300 may include a temperature measurement circuit TMMS 100 and a sense amplifier controller SACON 200 as described above. The temperature measurement circuit 100 may measure the operation temperature of the semiconductor memory device 2300 and generate the temperature code corresponding to the operation temperature. Based on the temperature code, the sense amplifier controller 200 may control the timing of the plurality of switching signals to reduce the sensing noises of the plurality of bitline sense amplifiers according to the operation temperature.

As described above, the semiconductor memory device and the method of controlling the semiconductor memory device according to one or more embodiments may increase the effective sensing margin of the bitline sense amplifier and enhance the performance of the semiconductor memory device by controlling the operation timing of the bitline sense amplifier to reduce the sensing noises according to the operation temperature.

Embodiments described herein may be applied to any memory device and system included a memory device. For example, embodiments may be applied to systems such as a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. A semiconductor memory device comprising:

a memory cell array comprising a memory cell;

a bitline sense amplifier having an open bitline structure and comprising a plurality of switching transistors, wherein the bitline sense amplifier is connected to the memory cell via a bitline and a complementary bitline, and the plurality of switching transistors are configured to control connections between the bitline, the complementary bitline, a sensing bitline and a complementary sensing bitline based on a plurality of switching signals;

a temperature measurement circuit configured to measure an operation temperature of the semiconductor memory device and to generate a temperature code corresponding to the operation temperature; and a sense amplifier controller configured to reduce sensing noise of the bitline sense amplifier by controlling timing of the plurality of switching signals based on the temperature code, wherein the sense amplifier controller is further configured to control the timing of the plurality of switching signals to cause a floating time during which the sensing bitline and the complementary sensing bitline are floated to decrease as the operation temperature increases.

2. The semiconductor memory device of claim 1, wherein the sense amplifier controller is further configured to control the bitline sense amplifier to operate in a sensing mode among a plurality of sensing modes by controlling the timing of the plurality of switching signals based on a temperature range within which the operation temperature falls from among a plurality of temperature ranges.

3. The semiconductor memory device of claim 1, wherein the sense amplifier controller is further configured to control the timing of the plurality of switching signals to cause the floating time to change based on a temperature range the operation temperature falls within from among a plurality of temperature ranges.

4. The semiconductor memory device of claim 1, wherein the plurality of switching transistors comprises:

a first switching transistor configured to control a connection between the bitline and the complementary sensing bitline based on a first switching signal;

a second switching transistor configured to control a connection between the complementary bitline and the sensing bitline based on the first switching signal;

a third switching transistor configured to control a connection between the bitline and the sensing bitline based on a second switching signal;

a fourth switching transistor configured to control a connection between the complementary bitline and the complementary sensing bitline based on the second switching signal; and a fifth switching transistor configured to control a connection between the sensing bitline and the complementary sensing bitline based on a third switching signal.

5. The semiconductor memory device of claim 4, wherein the operation temperature falls within a temperature range among a plurality of temperature ranges, the plurality of temperature ranges comprises a normal temperature range, a high temperature range higher than the normal temperature range, and a low temperature range lower than the normal temperature range, and wherein the sense amplifier controller is further configured to control the timing of the second switching signal and the third switching signal to cause the bitline sense amplifier to operate in a sensing mode from among a plurality of sensing modes based on the temperature range.

6. The semiconductor memory device of claim 5, wherein the sense amplifier controller is further configured to, based on the temperature range being the normal temperature range, cause the bitline sense amplifier to operate in an H-type sensing mode by:

during a charge sharing period, causing the sensing bitline and the complementary sensing bitline to be connected by activating the third switching signal, and during a sensing period after the charge sharing period, causing the bitline and the sensing bitline to be connected and causing the complementary bitline and the complementary sensing bitline to be connected by activating the second switching signal after the third switching signal is deactivated.

7. The semiconductor memory device of claim 5, wherein the sense amplifier controller is further configured to, based on the temperature range being the low temperature range, cause the bitline sense amplifier to operate in a D-type sensing mode by:

during a charge sharing period, causing the sensing bitline and the complementary sensing bitline to be disconnected by deactivating the third switching signal, during the charge sharing period, causing the bitline and the sensing bitline to be temporarily connected and causing the complementary bitline and the complementary sensing bitline to be temporarily connected by toggling the second switching signal between an activated state and a deactivated state, and during a sensing period after the charge sharing period, causing the bitline and the sensing bitline to be connected and causing the complementary bitline and the complementary sensing bitline to be connected by activating the second switching signal.

8. The semiconductor memory device of claim 5, wherein the sense amplifier controller is further configured to, based on the temperature range being the high temperature range, cause the bitline sense amplifier to operate in a C-type sensing mode by:

during a charge sharing period, causing the sensing bitline and the complementary sensing bitline to be disconnected by deactivating the third switching signal, during the charge sharing period, causing the bitline and the sensing bitline to be temporarily connected and causing the complementary bitline and the complementary sensing bitline to be temporarily connected by toggling the second switching signal, and before a sensing period after the charge sharing period, causing the bitline and the sensing bitline to be connected and causing the complementary bitline and the complementary sensing bitline to be connected by activating the second switching signal.

9. The semiconductor memory device of claim 5, wherein the sense amplifier controller is further configured to control the timing of the second switching signal and the third switching signal to cause the bitline sense amplifier to operate in a D-type sensing mode based on the temperature range being the low temperature range, to operate in a C-type sensing mode based on the temperature range being the high temperature range, and to operate in an H-type sensing mode based on the temperature range being the normal temperature range.

10. The semiconductor memory device of claim 4, wherein the sense amplifier controller is further configured to cause the bitline sense amplifier to operate in a D-type sensing mode by:

during a charge sharing period, causing the sensing bitline and the complementary sensing bitline to be disconnected by deactivating the third switching signal, during the charge sharing period, causing the bitline and the sensing bitline to be temporarily connected and causing the complementary bitline and the complementary sensing bitline to be temporarily connected by toggling the second switching signal, during a sensing period after the charge sharing period, causing the bitline and the sensing bitline to be connected and causing the complementary bitline and the complementary sensing bitline to be connected by activating the second switching signal, and based on the operation temperature increasing, causing a floating time during which the sensing bitline and the complementary sensing bitline are floated to decrease by delaying a time point at which the second switching signal is deactivated after the toggling of the second switching signal.

11. The semiconductor memory device of claim 4, wherein the sense amplifier controller is further configured to cause the bitline sense amplifier to operate in a D-type sensing mode by:

during a charge sharing period, causing the sensing bitline and the complementary sensing bitline to be disconnected by deactivating the third switching signal, before a sensing period after the charge sharing period, causing the bitline and the sensing bitline to be connected and causing the complementary bitline and the complementary sensing bitline to be connected by activating the second switching signal, and based on the operation temperature increasing, causing a floating time during which the sensing bitline and the complementary sensing bitline are floated to decrease by adjusting a time point at which the second switching signal is activated to a time point earlier in the charge sharing period.

12. The semiconductor memory device of claim 1, wherein the bitline sense amplifier comprises:

a first P-type transistor connected between a control line and the complementary sensing bitline, the first P-type transistor comprising a gate electrode connected to the sensing bitline;

a second P-type transistor connected between the control line and the sensing bitline, the second P-type transistor comprising a gate electrode connected to the complementary sensing bitline;

a first N-type transistor connected between a complementary control line and the complementary sensing bitline, the first N-type transistor comprising a gate electrode connected to the bitline; and a second N-type transistor connected between the complementary control line and the sensing bitline, the second N-type transistor comprising a gate electrode connected to the complementary bitline.

13. A semiconductor memory device comprising:

a memory cell array comprising a memory cell;

a bitline sense amplifier having an open bitline structure, wherein the bitline sense amplifier is connected to the memory cell via a bitline and a complementary bitline, the bitline sense amplifier comprising:

a first switching transistor configured to control a connection between the bitline and a complementary sensing bitline based on a first switching signal;

a second switching transistor configured to control a connection between the complementary bitline and a sensing bitline based on the first switching signal;

a third switching transistor configured to control a connection between the bitline and the sensing bitline based on a second switching signal;

a fourth switching transistor configured to control a connection between the complementary bitline and the complementary sensing bitline based on the second switching signal; and a fifth switching transistor configured to control a connection between the sensing bitline and the complementary sensing bitline based on a third switching signal;

a temperature measurement circuit configured to measure an operation temperature of the semiconductor memory device and to generate a temperature code corresponding to the operation temperature; and a sense amplifier controller configured to reduce sensing noise of the bitline sense amplifier by controlling timing of the first switching signal, the second switching signal and the third switching signal based on the operation temperature, wherein the sense amplifier controller is further configured to control the timing of the second switching signal and the third switching signal to cause the bitline sense amplifier to operate in a H-type sensing mode based on the operation temperature being in a normal temperature range, to operate in a C-type sensing mode based on the operation temperature being in a high temperature range higher than the normal temperature range, and to operate in an D-type sensing mode based on the operation temperature being in a low temperature range lower than the normal temperature range.

14. The semiconductor memory device of claim 13, wherein the sense amplifier controller is further configured to control the bitline sense amplifier to operate in a sensing mode among a plurality of sensing modes by controlling the timing of the first switching signal, the second switching signal and the third switching signal based on a temperature range within which the operation temperature falls from among a plurality of temperature ranges.

15. The semiconductor memory device of claim 13, wherein the sense amplifier controller is further configured to control the timing of the first switching signal, the second switching signal and the third switching signal to cause a floating time during which the sensing bitline and the complementary sensing bitline are floated to decrease as the operation temperature increases.

16. A method of controlling a semiconductor memory device, the method comprising:

providing a bitline sense amplifier having an open bitline structure and comprising a plurality of switching transistors, wherein the bitline sense amplifier is connected to a memory cell via a bitline and a complementary bitline, and wherein the plurality of switching transistors are configured to control connections between the bitline, the complementary bitline, a sensing bitline and a complementary sensing bitline based on a plurality of switching signals;

measuring an operation temperature of the semiconductor memory device to generate a temperature code corresponding to the operation temperature; and based on the temperature code, controlling timing of the plurality of switching signals to reduce sensing noise of the bitline sense amplifier, wherein the controlling the timing of the plurality of switching signals comprises:

controlling the timing of the plurality of switching signals to cause a floating time during which the sensing bitline and the complementary sensing bitline are floated to decrease as the operation temperature increases.

17. The method of claim 16, wherein the controlling the timing of the plurality of switching signals includes:

controlling the bitline sense amplifier to operate in a sensing mode among a plurality of sensing modes by controlling the timing of the plurality of switching signals based on a temperature range within which the operation temperature falls from among a plurality of temperature ranges.

18. The method of claim 16, further comprising:

performing a precharge operation comprising charging the bitline, the complementary bitline, the sensing bitline, and the complementary sensing bitline with a precharge voltage;

performing a first offset compensation operation comprising:

connecting the bitline and the complementary sensing bitline;

connecting the complementary bitline and the sensing bitline;

applying a first internal voltage higher than the precharge voltage to a P-type sense amplifier of the bitline sense amplifier; and applying a second internal voltage lower than the precharge voltage to an N-type sense amplifier of the bitline sense amplifier; and performing a second offset compensation operation comprising:

applying the precharge voltage to the P-type sense amplifier; and applying the second internal voltage to the N-type sense amplifier.

* * * * *